United States Patent [19]

Bickford et al.

[11] Patent Number: 4,999,572
[45] Date of Patent: Mar. 12, 1991

[54] REDUNDANT PULSE MONITORING IN ELECTRIC ENERGY METERING SYSTEM

[75] Inventors: Dale M. Bickford, Rochester, N.H.; Richard G. Farnsworth, York, Me.; Samuel G. Hardy, New Durham, N.H.; John R. Hawley, Durham, N.H.; Albert R. Varney, Jr., Rochester, N.H.

[73] Assignee: General Electric Company, Somersworth, N.H.

[21] Appl. No.: 423,530

[22] Filed: Oct. 16, 1989

Related U.S. Application Data

[63] Continuation of Ser. No. 246,067, Sep. 19, 1988, abandoned.

[51] Int. Cl.⁵ .................... G01R 11/36; G01R 13/38; G08C 5/12
[52] U.S. Cl. .................... 342/103 R; 324/142; 250/233; 379/107
[58] Field of Search ........... 324/142, 116, 103 R, 324/141; 340/870.02, 870.03; 364/482, 483, 493; 379/107; 346/14 MR; 250/233

[56] References Cited

U.S. PATENT DOCUMENTS

| | | | |
|---|---|---|---|
| 3,024,986 | 3/1962 | Strianese et al. | 250/233 |
| 3,733,493 | 5/1973 | McClelland, III | 250/233 |
| 3,786,423 | 1/1974 | Martel | 340/870.02 |
| 4,034,292 | 7/1977 | McClelland, III | 340/870.02 |
| 4,439,764 | 3/1984 | York et al. | 371/68 |
| 4,639,728 | 1/1987 | Swanson | 344/870.03 |
| 4,922,187 | 5/1990 | Beverly, II | 324/142 |

Primary Examiner—Reinhard J. Eisenzopf
Assistant Examiner—Vinh P. Nguyen
Attorney, Agent, or Firm—Robert E. Brunson

[57] ABSTRACT

Redundant pulses generated by independently operable pulse sources in an electricity meter are accumulated as pulse counts in a pair of channels of a multi-channel recorder. The pulse counts are compared to verify the accuracy of the pulses counted by each channel. If the difference between the values of the pulse counts exceeds a predetermined threshold value, a trouble indicator is turned on and a telephone call is initiated by the recorder to notify a data center that a system malfunction has occurred which is disrupting the accumulation of pulses in one of the channels of the recorder. The pulse counts are stored in the recorder as substantially duplicate independent measures of energy usage by a load connected to the electricity meter, to be thereafter retrieved from the recorder to obtain energy survey and billing data. The recorder also maintains a system status error log which records the time and date of each malfunction and the identification of the channel pair where the malfunction occurred. In one embodiment, the operation of the recorder is controlled by a programmable microprocessor. Combinations of independent power sources for powering the recorder and the pulse sources are employed to enhance system reliability by making each of the pulse sources and the recorder substantially independently operable.

45 Claims, 7 Drawing Sheets

| | | | | |
|---|---|---|---|---|
| DIFFERENCE TRIGGER VALUE (DTV) - CONSTANT | | | | |
| NUMBER PULSES TO TRIGGER ERROR TEST - CONSTANT | | | | |
| CHANNEL ADDRESS COUNTER | | | | |
| CHANNEL 1 DIFFERENCE COUNTER | CHANNEL 1 & 2 PAIR | | | |
| CHANNEL 2 DIFFERENCE COUNTER | | | | |
| | | | | |
| CHANNEL N DIFFERENCE COUNTER | CHANNEL N & N+1 PAIR | | | |
| CHANNEL N+1 DIFFERENCE COUNTER | | | | |
| CHANNEL 1 ACCUMULATOR | | | | |
| | | | | |
| CHANNEL N ACCUMULATOR | | | | |
| CHANNEL 1 STORAGE REGISTER | | | | |
| | | | | |
| CHANNEL N STORAGE REGISTER | | | | |
| NEED TO TEST FLAG | ERROR FLAG CHANNELS 1 & 2 PAIR | | ERROR FLAG CHANNELS N & N+1 PAIR | TROUBLE FLAG |
| ERROR STATUS CHANNELS 1 & 2 PAIR | PRESERVATION STORAGE | | | ERROR STATUS CHANNELS N & N+1 PAIR |
| SYSTEM STATUS ERROR LOGS | | | | |
| DATA | TIME | NEW STATUS CHANNELS 1 & 2 PAIR | NEW STATUS CHANNELS N & N+1 PAIR | OLD STATUS CHANNELS 1 & 2 PAIR | OLD STATUS CHANNELS N & N+1 PAIR |
| | | | | |
| DATA & TIME REGISTER | | | | |

*FIG. 14*

REDUNDANT PULSE MONITORING IN ELECTRIC ENERGY METERING SYSTEM

This is a continuation of copending application Ser. No. 07/246,067 filed on 9/19/88, now abandoned.

BACKGROUND OF THE INVENTION

The present invention relates generally to electric energy remote metering and data recording systems and more particularly, to methods and apparatus for detecting the occurrence of a system malfunction and enhancing the preservation of reliable and verifiable metering data collected from remote metering locations.

Electric utilities frequently use data recorders (generally referred to as demand or load profile recorders) for monitoring energy consumption as measured by a meter connected to a consumers load. Typically, these recorders are designed to record electrical pulses proportional to energy consumption which are provided to the recorder by a pulse initiator in the meter. Modern day electronic recorders are designed to transmit the recorded data to a central computer, via telephone lines, to enable the utility to process the data to bill the consumer according to his energy consumption. One such type electronic recorder is disclosed in U.S. Pat. No. 4,639,728. Another similar recorder is disclosed in U.S. Pat. No. 4,439,764.

Utilities also use the transmitted data for; (i) conducting load surveys for load management purposes, (ii) profiling of a consumers energy consumption, and (iii) the collection of data to justify rate modifications.

Recorders of the above type are ideally suited for use in meter installations which are widespread or not easily accessible. These recorders may also be used in installations where a utility wants to simultaneously monitor large numbers of meters throughout a utility power network, or several meters located at a large energy consumer account such as a commercial or industrial user. Because the accumulated metering data is to be used for billing and other purposes as set forth above, utilities want to be assured that the collected data does not get lost and that it is accurate and verifiable. An abnormality, such as a malfunction in the power generating system or in the metering or recording equipment, can cause the loss of valuable revenue or survey data. Thus, immediate notification of a malfunction is another requirement. In order to achieve these assurances, means must be provided to detect the presence of a malfunction and to protect against the loss of revenue and load profile data in the recorder and to further verify that the protected data is valid. To appreciate how a remote metering system of the type contemplated by the present invention may be used to provide the above assurances, it is considered advantageous to briefly describe how meters and their associated registers have been used in remote metering and data recording systems.

It is well known that watthour meters, and similar types of meters, contain a register or registers for accumulating and displaying various quantities of energy consumption, such as total kilowatt-hours, watthour demand, etc. The conventional induction watthour meter, with rotating disc and shaft, contains a mechanical register (driven by a gear on the shaft) which continuously displays the total accumulated kilowatt hours consumed. Switch or clutch activatable mechanical demand and time of use registers are also used on these meters to display demand and time of use quantities (ie, the amount of energy consumed over a predetermined time of use period or a specified time interval within a time of use period).

In recent years, micro processor based electronic registers have been developed for use on conventional watthour meters to accumulate pulse data proportional to power consumption. This pulse data is usually provided to the register from an optical pick up or sensor device which senses meter disc rotation. These registers come in varying degrees of sophistication, and have the advantage that they can perform calculations on accumulated pulse data and electronically display much more information than is possible with a conventional mechanical type register. A pulse initiator device is also frequently used in conjunction with an electronic register to provide relay contact (form A and C) pulses proportional to power consumption to an external recorder of the type contemplated by the present invention. The pulse initiator device is driven by pulses from the electronic register. The pulse initiator can be either an integral part of the register or separate therefrom.

When it is desirable to provide relay contact pulse data to a recorder from a meter which does not have an electronic register, a separate pulse initiator is usually installed adjacent to or in the meter. In this instance, the pulse initiator receives its input data pulses directly from the optical pick up device in the meter.

When electronic registers are used, a major concern to the utilities is that a system failure or equipment malfunction, if left undetected for a sustained period (such as a month, between meter readings) can cause a significant loss of valuable revenue data. Typical problems which cause a loss of revenue data are, power line or transformer failures, loss of power to the electronic register or a malfunction in the electronic register or optical pickup device. In addition, when a recorder is used to record pulse data, any system failure or malfunction which disrupts the pulse initiator output pulses from the meter can result in the loss of data being fed to the recorder. This loss of recorder data is particularly critical, because that data is also used by the utilities to bill consumers. The present invention substantially reduces the possibility of losing this recorder data. The invention also provides the capability to minimize the loss of data in the electronic meter register by quickly detecting and indicating the presence of a system abnormality affecting the register performance. Such indication allows the utility to take immediate action to correct the abnormality.

To partially satisfy the above concern, electronic registers have been teamed with conventional mechanical type registers on conventional induction type watthour meters. This teaming of registers provides a certain amount of verifiable back up data for the utilities not otherwise available. For example, if an electronic register fails, or fails intermittently to collect data, and all or part of its data is lost, the mechanical register will preserve at least that part of the meter data duplicated on the mechanical register. Mechanical registers are very reliable. However, if the mechanical register fails, the electronic register will provide the necessary backup data.

From the foregoing, it can be seen that, at best, the teaming of an electronic register with a mechanical register provides a means of protecting against the loss of only a portion of the meter data when the electronic register fails. Furthermore, in the case of a recorder, loss of pulse data from the meter can result in the non-recording of valuable revenue data during that period of time that data pulses to the recorder are interrupted. This can result in the recording of invalid or incomplete data unless means is provided to ensure that the data which gets recorded is as valid as possible. Thus, it can be seen that a need exists to protect against the loss of recorder data in the event of an abnormality in the metering system which causes a disruption in the pulse data signals to the recorder. In addition, a need exists to quickly notify the electric utility of a system abnormality and to provide assurance that the protected data is valid and verifiable.

The aforementioned U.S. Pat. No. 4,639,728 discloses a system for verifying meter data provided to an electronic recorder. That system employs a conventional watthour meter having a mechanical register for registering total kilowatt hours. A pulse initiator in the meter generates KYZ relay contact output pulses. The KYZ pulses are provided to a micro processor based electronic demand recorder. These pulses are accumulated by the recorder over a number if successive intervals to make up a record. An encoder in the meter can be interrogated by the recorder. The encoder permits reading of the mechanical positions of the dials on the meter register into the recorder. At the end of the aforementioned record, the register dial positions, as indicated by the encoder, are read and stored by the recorder. The accumulated KYZ pulse data and the encoded register data are compared. If there is an acceptable correlation between the accumulated pulse data (KYZ pulse count) and the encoded register data (dial reading), the pulse data accumulated during the several successive intervals of the record are deemed verified.

The use of an encoder for the verification of pulse data as disclosed in the above mentioned patent has disadvantages and limitations. One disadvantage is that the encoder cannot provide full back up (redundant) data to support the KYZ pulse contact data that might get lost or corrupted due to a system abnormality or malfunction. Since an encoder is read to provide a single reading of the register dials only at the end of a lengthy record, the encoder data is useful only to determine that no error has occurred in the KYZ pulse data recorded since the last encoder reading. If an error is detected, then the recorded pulse data is suspect and thus considered invalid. Since the encoder does not provide any duplicate back up data to support the invalid KYZ pulse data, the latter data is, for all practical purposes, lost because it is unusable for billing purposes. As a result, the only useable revenue data left is the total kilowatthour reading from the meter dial encoder.

Another disadvantage of dial encoders is they cannot be used in fully electronic watthour meters. This is due to the fact that these types of meters contain fully electronic registers instead of the conventional mechanically driven registers. Thus, an encoder is precluded from use in reading an electronic register. Examples of fully electronic watthour meters are disclosed in U.S. Pat. Nos. 4,535,287 and 4,556,843. These patents are assigned to the assignee of the present invention.

From the foregoing, it is clear that a need exists for a recorder system having universal application with all types of watthour meters (electronic and induction) and which protects against the loss of recorded meter data and which further promptly detects a system abnormality affecting the recording of such data. The present invention is directed toward fulfilling these needs as set forth in the following description of the invention.

SUMMARY OF THE INVENTION

Accordingly it is an object of the invention to provide an apparatus and method for the verification of pulse type metering data.

It is a further object of the invention to provide a method and apparatus in a remote meter recording system for the verification of pulse-type metering data and which is capable of permitting the reconstruction of such data for revenue billing in the event a system abnormality causes an error in such data.

It is still a further object of the invention to provide a system for the protection and verification of pulse-type metering data proportional to energy usage by a load wherein redundant pulse data representative of independent measures of the same energy usage by the load is recorded in independently operable parallel channels of a recording device.

It is another object of the invention to provide a system for metering electric energy usage by a load capable of accumulating verifiable backup energy usage data.

It is a still further object of the invention to provide an electricity metering system and a method therein for accumulating verifiable back up energy usage data and expeditiously providing an indication of a system abnormality affecting the accumulation of energy usage data.

It is another object of the invention to provide a remote metering and data recording system capable of recording redundant pulse-type metering data in pairs of independently operable recording channels.

It is a still further object of the invention to provide a data recording system for the protection of pulse-type metering data capable of maintaining the recorded data substantially intact even though a system abnormality causes a corruption in the pulse-type metering data.

It is another object of the invention to provide a remote metering and data recording system for the verification and protection of pulse type metering data provided by meters in the system and which obviates the use of dial encoders on such meters.

It is a still further object of the invention to provide a remote metering and data recording system capable of testing for the operation of at least two independently operable meters in the system, each of which is generating pulse type metering data representative of an independent measure of the same energy usage by a load connected to the meters.

It is another object of the invention to provide a remote metering and data recording system having a multi-channel recording apparatus capable of recording pulse-type metering data representative of energy measures provided by at least two independently operable electronic meters providing redundant pulse trains representative of at least two different independent measures of energy usage by a load and comparing the redundant pulse trains to verify the accuracy of metering data while testing for a system abnormality affecting the generation of pulses from the meters.

It is a still further object of the invention to provide a technique for the verification of pulse-type metering data wherein pulse trains from two independent pulse sources are recorded in independent channels of a single recorder. In the event that the two recorded pulse trains fail to agree within predetermined limits, an alarm is initiated.

It is another object of the invention to provide a system for the protection and verification of pulse-type metering data having enhanced capabilities.

Briefly stated, the present invention provides an electric energy metering system comprised of at least one data channel pair. Two data channels comprise one pair. Two independently operable pulse sources (one for each channel of a pair) are provided for generating pulses proportional to the consumption of electric energy by a common load. The pulses from the two sources are separately accumulated as redundant pulse counts, each having a value proportional to energy usage. The accumulated values in a channel pair are compared and, if the difference between those values exceeds a predetermined threshold value, an error message or signal is generated to indicate that a system abnormality or malfunction has corrupted the generation of the output pulses from at least one of the redundant pulse sources. The error signal or message serves to provide a visual indication of a malfunction and triggers the generation of an alerting telephone call to a data center. Upon the detection of a malfunction, the date, time and error status of the channel pair wherein the error occurred are recorded in a status log. Combinations of separate power sources are implemented to make each data channel substantially independently operable of the other data channel.

The above, and other objects, features and advantages of the present invention will become apparent from the following description read in conjunction with accompanying drawings, in which like reference numerals designate the same elements.

BRIEF DESCRIPTION OF THE DRAWINGS

FIG. 14 is useful in understanding the flow charts of FIGS. 11-13 and is a schematic representation of data mapped into the memory of the programmed processor of the electronic data recorder.

DETAILED DESCRIPTION OF THE PREFERRED EMBODIMENT

Figure 1:
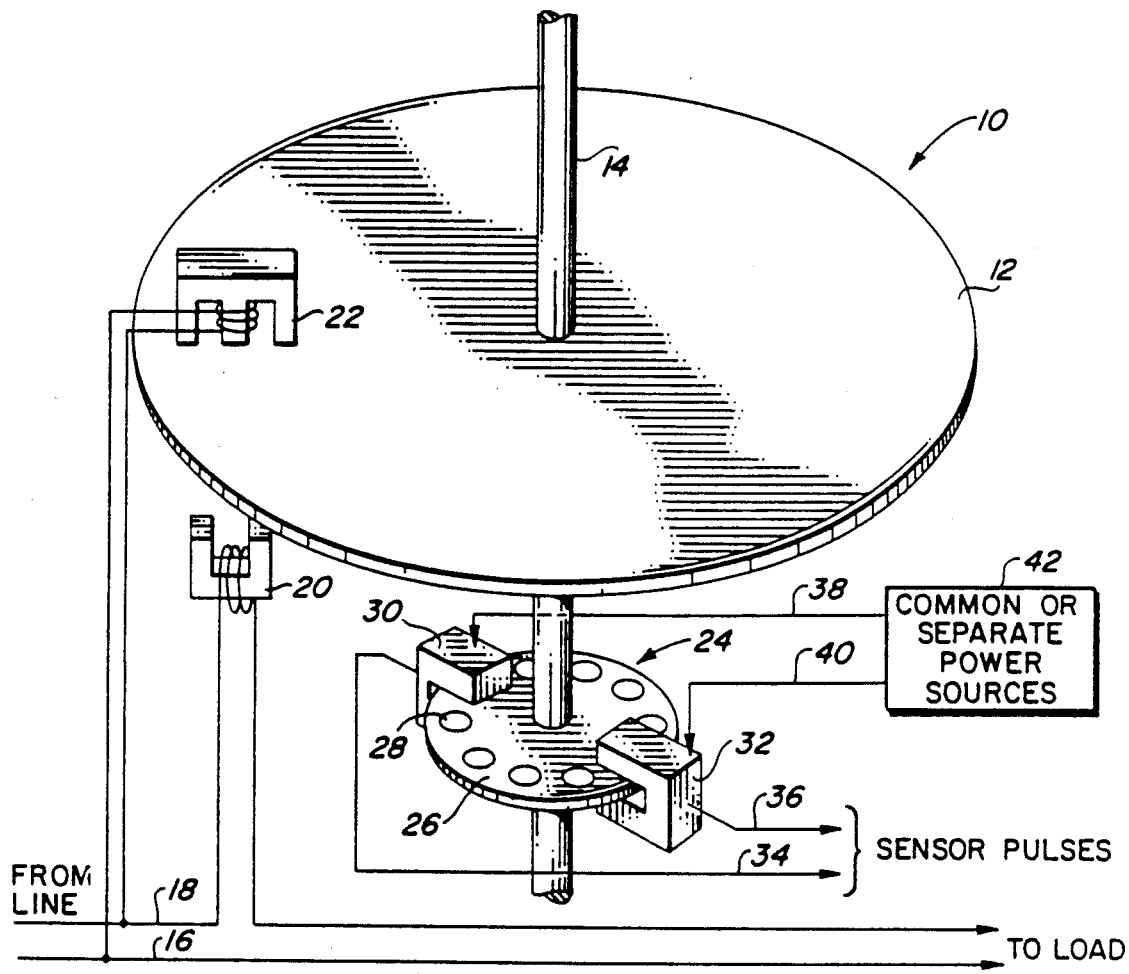
FIG. 1 is a perspective view of that portion of a watthour meter showing independently operable pulse sources for sensing meter disc rotation and generating redundant sensor pulses according to one embodiment of the invention.

Referring to FIG. 1, there is shown generally at 10 that portion of a conventional induction type kilowatt-hour meter comprised of a rotating element, shown as an Eddy-current Disk 12, which is supported by an integral Shaft 14 rotatably mounted in bearings (not shown) at opposite ends of the shaft. The Disc is rotated, at a rate proportional to power consumed by a load (not shown) connected to Power Line Conductors 16 and 18. This rotation is effected in well known fashion by eddy currents proportional to line current and line voltage which are induced into the Disc 12 from conventional Current and Voltage coils 20 and 22 respectively. Current and voltage are provided to Coils 20 and 22 from an electric utility power source (not shown) via Power Lines 16 and 18.

An important aspect of the invention is shown in FIG. 1 generally at 24 as a dual or redundant Pulse Source for generating redundant Output Sensor Pulses at a rate proportional to power consumed by the load on Lines 16 and 18 and as determined by the rate of rotation of Disc 12.

The dual Pulse Source Generator 24 is comprised of a Shutter Disc 26 having a plurality of Apertures or Holes 28 formed therein. The Shutter Disc 26 is rotatably secured to Shaft 14 and rotates at the same rate as Disc 12. Two generally U-shaped independently operable Disc Sensing Devices 30 and 32 are provided as part of the Pulse Generator 24 to provide the redundant Output Sensor Pulses on Conductors 34 and 36. Sensing Devices 30 and 32 are of known type, preferably each having a light emitting diode (not shown) in one leg of the U for impinging light on one side of the Shutter Disc 26 and a photo-cell detector (not shown) on the other leg of the U on the opposite side of the Disc for sensing light transmitted through the Apertures 28 as the Disc 26 rotates to thus generate the Sensor Pulses. Operating voltages for the light emitting diodes and photo-cell detectors in Sensing Devices 30 and 32 are provided on Conductors 38 and 40 from a conventional power supply shown as a Power Source 42. The Power Source 42 can be either a common power supply feeding a common voltage to the Sensing Devices 30 and 32, or two separate power supplies providing independently derived voltages to those devices. The use of separate power sources has the distinct advantage of ensuring that one of the Sensing Devices 30 and 32 will continue to operate even if one power supply fails.

From the foregoing, it can be seen that each of the Sensing Devices 30 and 32 is an independently operable device. System reliability is enhanced by the redundant generation of the Sensor Pulses from Devices 30 and 32, because failure of one Sensing Device, or of its associated Power Source or Supply, does not cause loss of Sensor Pulses from the other Device. Further, as will hereinafter be described, the redundant generation of the Sensor Pulses also makes it possible to quickly detect the presence of a system abnormality or malfunction while still retaining valid metering data.

Figure 2:
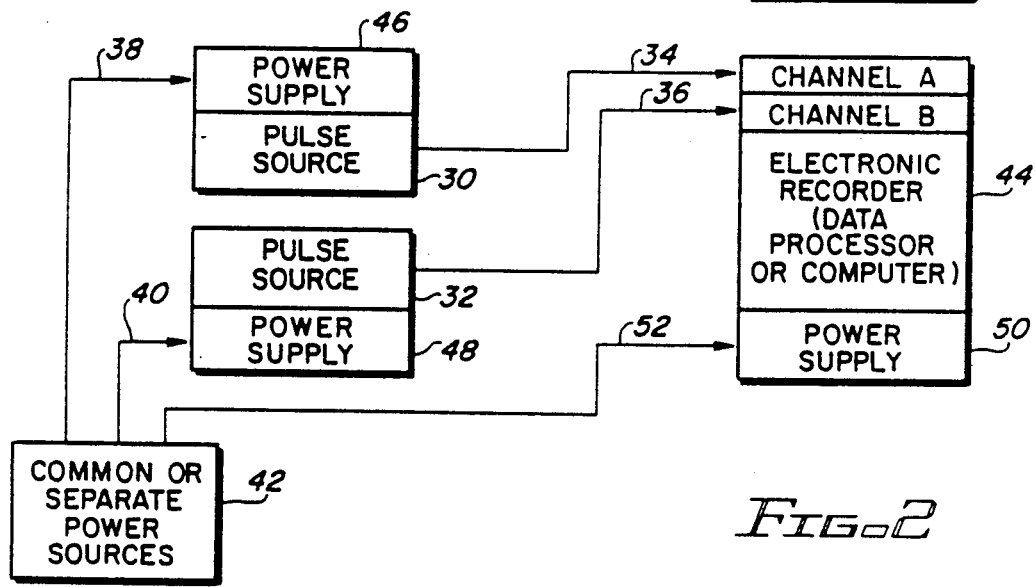
FIG. 2 is a simplified block diagram of an electric energy remote metering system illustrating independently powered redundant pulse sources and a recorder according to a further embodiment of the invention.

The Sensor Pulses from Sensing Devices 30 and 32 are provided on separate data or recording channels to a Multi-channel Electronic Recorder as shown in FIG. 2. The Recorder, shown generally as 44, is preferably comprised of a conventional microprocessor (or micro computer) having its own memory (not shown) for storing a computer program and for processing of meter data received on a Channel Pair comprised of Channels A and B from Sensing Devices 30 and 32.

Figure 3:
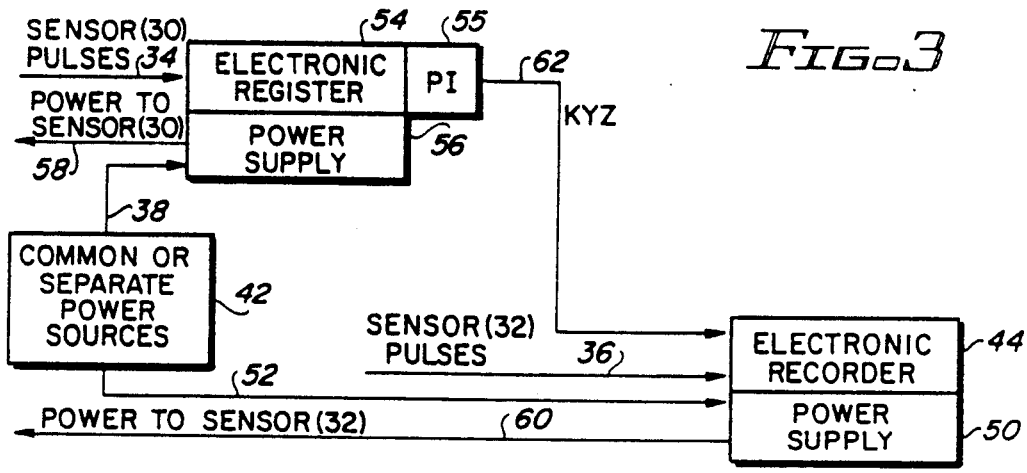
FIG. 3 is a simplified block diagram of an electric energy remote metering system illustrating independently powered and independently operable data channels when an electronic register is used to provide pulses to a recorder for recording redundant pulses according to another embodiment of the invention.
Figure 4:
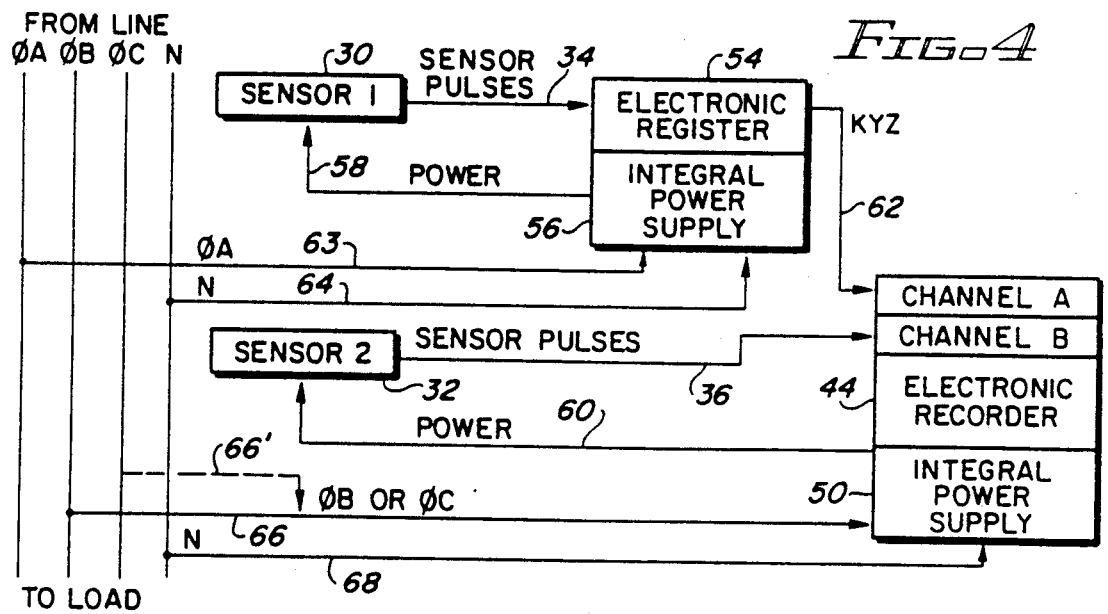
FIG. 4 is a simplified block diagram of an electric energy remote metering system illustrating independently operable data channels powered from separate phases of a polyphase power system.

One of the major features of the invention is to design as much reliability into the system as is economically justified. This reliability is accomplished by the present invention by providing various combinations of power sources and power supplies for each recording channel in the system so as to make each channel as independently operable as possible. FIGS. 2, 3 and 4 show alternative power source and power supply combinations to achieve this independent operation. The power supply combination is generally dependent upon the types of meters, registers and pulse initiators, used to provide pulses to the Recorder 44.

As shown in FIG. 2, each of the Pulse Sources or Sensing Devices 30 and 32 contains its own integral power supply (shown as 46 and 48) for powering the aforementioned photo detectors and light emitting diodes contained within Sensing Devices 30 and 32. Operating voltages for Power Supplies 46 and 48 are provided from the Power Source 42 on Conductors 38 and 40 respectively. The Power Source 42 may be either a single or dual dc source [such as a battery(s) or dc power supply(s)]. If ac power is to be provided to Power Supplies 46 and 48 from a single phase power source, Power Source 42 may be the Power Lines 16 and 18 as shown in FIG. 1. If totally separate ac power sources are used, Power Source 42 may provide separate operating output voltages derived from any two of the $\phi A-\phi C$ polyphase power lines of FIG. 4.

Still referring to FIG. 2, additional redundancy is built into the system by providing the Recorder 44 with its own integral Power Supply 50 for supplying the necessary operating voltages to the recorder circuitry. Operating voltage for Power Supply 50 is provided, via Conductor 52, from either a common or separate (dual) power source as previously described for Power Supplies 46 and 48.

FIG. 3 shows another embodiment of a power supply combination which is ideally suitable for use in the system when an Electronic Register 54 is incorporated in a conventional induction type Meter such as 10 in FIG. 1. In this embodiment, the Electronic Register 54 contains its own integral Power Supply 56 for supplying the necessary voltages to the register circuitry. The Power Source 42 may provide operating voltages to the Power Supply 56 in Register 54 and to Power Supply 50 in the Recorder 44 as previously described.

In the embodiment of FIG. 3, economy and reliability are achieved by providing the necessary operating voltages to Sensor Devices 30 and 32 from the already resident Power Supplies 56 and 50 in the Register 54 and Recorder 44. Power to Sensor 30 is provided on Conductor 58 from the Register Power Supply 56 and power for Sensor 32 is provided on Conductor 60 from the Recorder Power Supply 50. This arrangement in FIG. 3 obviates the need for a power supply in each of the Sensors 30 and 32 as shown in FIG. 2.

Still referring to FIG. 3, the Sensor Pulses on Conductor 34 from Sensor 30 are fed to the Electronic Register 54. Register 54 is normally mounted in the Meter 10. Electronic registers of the type contemplated by the invention are well known. Such registers are generally referred to by the functions they perform, such as kilowatt hour, or time of use registers or demand registers. Typical registers are disclosed in U.S. Pat. Nos. 4,571,692 and 4,465,970, which are assigned to the assignee of the present invention.

The output of the Electronic Register 54 is shown on a Conductor 62 as providing KYZ relay pulse contact signals, via a pulse Initiator 55 proportional to energy consumption to one of the channels in the Recorder 44, such as Channel A in FIG. 2. The KYZ pulses are provided from a conventional pulse initiator normally used in kilowatthour meters when pulses are to be provided to an externally connected recording device, such as Recorder 44. Pulse initiators of the type suitable for use with the Register 54 are sold by General Electric Company as Types D-53 and D-72 or equivalents thereof. The pulse initiator may be free-standing or an integral part of the Register 54. The Electronic Register 54 provides pulses directly to the pulse initiator, which converts those pulses to the relay contact KYZ pulses.

Sensor Pulses from Sensor 32 of FIG. 1 are provided directly to another channel of the Recorder 44 of FIG. 3 on Conductor 36. If desirable, however, a second pulse initiator (not shown but normally mounted in Meter 10) may be provided to convert the pulses from Sensor 32 to KYZ pulses for input to the Recorder on Conductor 36.

FIG. 4 shows a system power supply and power source combination in a preferred form when the metering and recording system is connected to a polyphase power system. This combination further enhances the reliability of the system by providing power to each of the Register and Recorder Power Supplies 56 and 50 from separate and distinct phases of the polyphase power system.

As shown in FIG. 4, $\phi A$ and N (neutral) provide ac power on Conductors 63 and 64 to the Electronic Register Power Supply 56. The Electronic Recorder Power Supply 50 receives its ac power (alternatively) from either $\phi B$ or $\phi C$ and N via Conductors 66 (or 66') and 68 respectively.

In FIG. 4, power (operating voltage) for Sensors 30 and 32 is provided via Conductors 58 and 60 from the Register and Recorder Power Supplies 56 and 50 in the manner described for FIG. 3. Also, in a manner similar to that previously described for FIG. 3, the Sensor Pulses on Conductor 34 are applied to Register 54, the Sensor Pulses on Conductor 36 are applied to Channel B of the Recorder 44 and the KYZ pulses on Conductor 62 are applied to Channel A of the Recorder.

Figure 5:
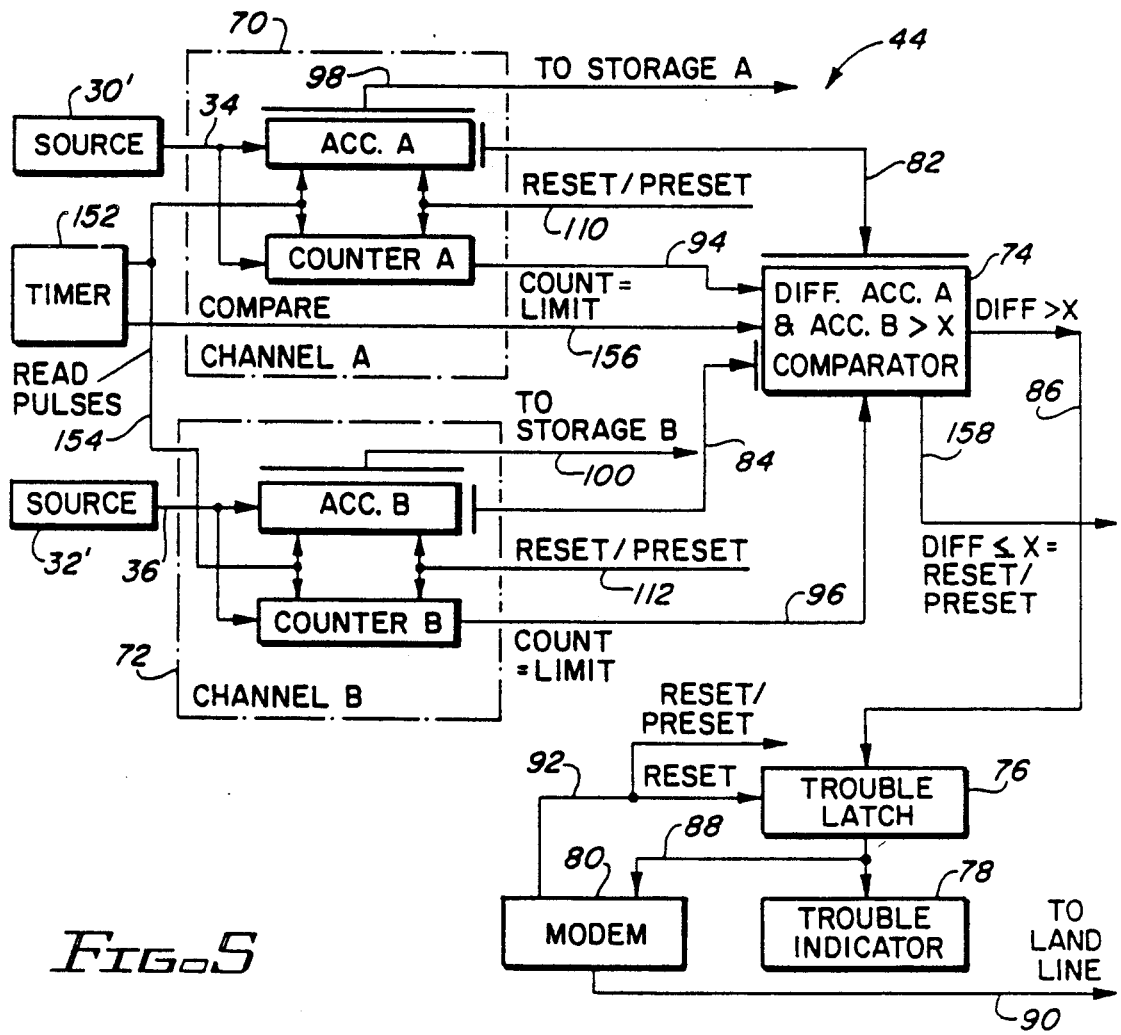
FIG. 5 is a schematic block diagram of an electric energy remote metering system illustrating redundant data channels in a recorder for detecting a system malfunction and providing an indication thereof according to one embodiment of the invention.

Having described the various power source and power supply combinations contemplated by the invention, reference is first made to FIG. 5 for a description of one embodiment of the invention.

FIG. 5 shows a functional schematic block diagram of an embodiment of the Electronic Recorder 44 comprised of a pair of Recording Channels 70 and 72 (designated Channels A and B), a Comparator 74, a Trouble Latch 76, a Trouble Indicator 78 and a Conventional Telephone Modem 80.

Each of the Recorder Channels 70 and 72 includes an Accumulator Register and a Counter shown as ACC. A and Counter A in Channel 70 and ACC. B and Counter B in Channel 72. Pulse Sources 30' and 32' (such as Sensor Devices 30 and 32) provide serialized redundant pulses to ACC. A and ACC. B and Counters A and B of Channels 70 and 72 on Conductors 34 and 36 respectively.

The outputs of ACC. A and ACC. B are each connected to the Comparator 74 via a plurality of parallel Conductors 82 and 84 respectively. The Comparator 74 is of conventional well known design for algebraically subtracting the contents of ACC. A and ACC. B. The difference resulting from the subtraction is then compared to a predetermined threshhold value or count, designated X, and if that difference is greater than X, an error or trouble signal (DIFF>X) is generated on a Conductor 86. The error signal on Conductor 86 sets a Trouble Latch 76, such as a flip flop or other type latching circuit. The latch output on Conductor 88 turns on a Trouble Indicator 78, such as a light emitting diode, when the Latch 76 is set. Simultaneously, the latch output turns on a Telephone Modem 80 to initiate a telephone call on the telephone Land Line 90 to notify a data center or central computer (not shown) of the presence of a system malfunction or abnormality affecting the accumulation of data by the Recorder. The Trouble Latch 76 is reset, via a Conductor 92, from the Modem as soon as the call is placed, or alternatively the reset can take place by a command from the data center when the data center acknowledges receipt of the error condition. The Trouble Latch 76 can also be reset by the manual activation of a switch (not shown) by a repairman visiting the site of the recorder. The signal on Conductor 92 is also used as the Reset/Preset signal to reset ACC. A and ACC. B and preset a count into Counters A and B via Conductors 110 and 112 at the end of each read cycle. A read cycle begins when ACC. A and ACC. B and Counters A and B are reset/preset and terminates when a Count=Limit signal is generated by either one of the Counters A or B. The operation of Counters A and B will subsequently be described.

Still referring to FIG. 5, the comparison of ACC. A and ACC. B is effected by the Count=Limit signal from either one of the Counters A or B on Conductors 94 or 96 respectively.

The data accumulated by ACC. A and ACC. B may also be stored in separate storage registers (not shown). This data is provided to a Storage A on Conductor 98 and Storage B on Conductor 100.

A Timer 152 provides Read Pulses on a Conductor 154 to the elements ACC. A and B and Counters A and B to clock the Sensor Pulses into those elements. A Compare signal on a Conductor 156 from the Timer 152 follows each Read Pulse to time the comparison of ACC. A and B. At the time of the comparison, and if either Counter A or B has reached its count limit and if there is no error, a signal DIFF≦X is generated on a Conductor 158 from the Comparator 74. The DIFF≦X signal is used to reset ACC. A and B and preset Counters A and B on Conductors 110 and 112. The read cycle is then repeated until the next generation of a Count=Limit signal to trigger the next comparison of ACC. A and B. If the comparison as just described yields an error, the DIFF>X signal on Conductor 86 sets the Latch 76 which turns on the Indicator 78 and initiates a phone call on Line 90 from the Modem 80. In this instance, ACC. A and B and Counters A and B are reset/preset via Lines 92, 110 and 112 as previously described.

Figure 7:
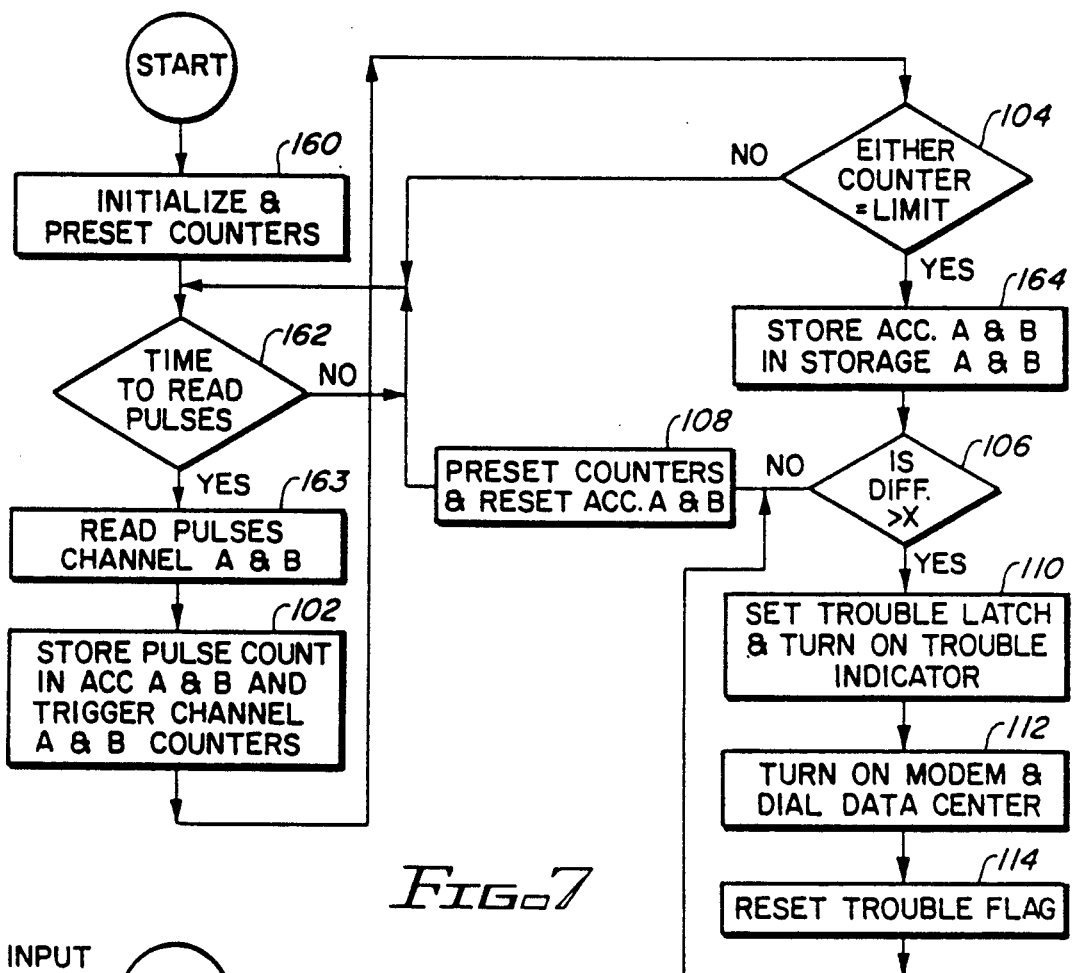
FIGS. 7 and 8 are flow charts associated with FIGS. 5 and 6 respectively, and are useful in understanding the method of operation of the invention.

As an aid to a more thorough understanding of the operation of the embodiment of FIG. 5, reference is now made to the functional flow chart of FIG. 7 which discloses the sequence of steps and the method of operation of that embodiment. When the system is first turned on (i.e. power applied), ACC. A and ACC. B and the Latch 76 are reset and the Timer 152 is initialized to start a read cycle. Depending upon the choice of the designer, Counters A and B can be of a design to be either reset or preset to some predetermined count. These counters will then be either counted up or down by the Sensor Pulses to achieve some predetermined count limit to generate the Count=Limit signal. For example, the counters can be preset so that the Count=Limit signal from either Counter A or B will occur on overflow or underflow of either Counter A or B.

After initialization the Recorder 44 goes into an idle state as shown by a Time To Read Pulses decision Block 162 in FIG. 7. The length of time the Recorder remains in this idle state is determined by the spacing (times of occurrence) between the Read Pulses on Conductor 154 from the Timer 152. In order to prevent missing any Sensor Pulses from the Sensors 30 and 32, the time between Read Pulses preferably should not exceed the minimum spacing or time expected between the occurrence of the Sensor Pulses. It has been determined that, a watthour meter under maximum load and which generates twelve sensor pulses per revolution of the Sensor Disc 34, an optimum read sampling rate of every six milliseconds ensures against the loss of any Sensor Pulses from the Sensors 30 and 32.

When a Read Pulse from Timer 152 occurs, the Sensor Pulses are read as shown by entry into a Read Pulses Channel A and B Block 163. The Sensor Pulses present on Conductors 34 and 36 (FIG. 5) are then stored in ACC. A and ACC. B. These Pulses also trigger the Channel Counters A and B as shown in Block 102. At the time a Read Pulse occurs, and if no Sensor Pulse is present at the input of a particular channel, that channel's accumulator and counter will not be affected (i.e., no change in state of the accumulator or counter will occur).

Immediately following each Read Pulse on Conductor 154, the Timer 152 applies a Compare signal on Conductor 156 to the Comparator 74. This signal has no affect on the Comparator unless the Count=Limit signal is present on either of Conductors 94 or 96. The primary signal to trigger the Comparator 74 to compare ACC. A and ACC. B is the Count=Limit signal from either of Counters A or B.

As shown in FIG. 7, the Recorder 44 next tests in an Either Counter=Limit Block 104 to check if either Counter A or B has achieved its count limit (e.g. over or underflow). If neither Counter has achieved its count limit, no action is taken by the Comparator and the Recorder returns to the idle state (via the NO branch of Block 104) until another Read Pulse occurs.

The above described reading, accumulating and counting of the Sensor Pulses in Channels A and B will continue until one of the Counters A or B achieves its count limit.

Let it now be assumed that Counter A has achieved its count limit. As shown in Block 104, the flow chart exits a YES branch into an action Block 164 wherein the contents of ACC. A and ACC. B are stored in Storage A and Storage B respectively. While not shown in FIG. 5, this storage could be effected by using the Count=Limit signal on Conductor 94 to gate ACC. A and B into Storages A. and B.

As shown in a decision Block 106 of FIG. 7, a test is performed to see if the difference between the values of ACC. A and ACC. B is greater than the threshold value X. If that difference is not greater than X, there is no pulse accumulation error, thus, Block 106 is exited through its NO branch into an action Block 108. In Block 108, Counters A and B are preset and ACC. A and B are reset in preparation for another read cycle. In FIG. 5, the Reset/Preset signal on Conductors 110 and 112 performs these latter actions and is effected by the DIFF≦X=Reset/Preset signal on Conductor 158. As previously described, this latter signal is generated at the time of the Compare signal on Conductor 156.

The preceding description assumed that Counter A had achieved its count limit. The operation will be the same as just described if Counter B had achieved its count limit prior to Counter A.

Reference is now made to FIG. 5 and back to the action Block 106 of FIG. 7. Let it now be assumed that one of the Counters A or B achieves its count limit and generates a corresponding Count=Limit output signal to the Comparator 74 on one of the Conductors 94 or 96. Also, let it be assumed that the difference between the values of ACC. A and ACC. B is greater than the threshold value X, thus indicating that a malfunction has occurred disrupting the accumulation of Sensor Pulses in one of the ACC. A or ACC. B. As a result, upon generation of the next Compare signal on Conductor 156, the Comparator 74 generates the DIFF>X signal on Conductor 86 to the Trouble Latch 76.

The next operation which takes place is shown in FIG. 7 by the flow chart exiting the YES branch of Block 106 into an action Block 110. In action Block 110, the DIFF>X signal sets the Trouble Latch 76, which in turn, via Conductor 88, turns on the Trouble Indicator 78 and the Modem 80 (Block 112 of FIG. 7). In Block 112 the Modem also initiates a telephone call by dialing the data center via the Land Line 90. After the phone call is placed, the Trouble Latch 76 is reset from the Modem via Conductor 92 as previously described. This reset action is shown in an action Block 114 of FIG. 7.

Counters A and B and ACC. A and ACC. B are again reset and preset, respectively, in Block 108 at substantially the same time that the Latch 76 is reset. This reset/preset is via the signal on Conductor 92 of FIG. 5. As previously described, ACC. A and ACC. B and Counters A and B may be reset/preset from the Modem 80, via Conductor 92 at the time the Modem places the call, or at a later time when the data center sends a command to the Modem acknowledging receipt of the telephone call. In order to prevent the loss of any Sensor Pulses from being accurately recorded in Channels A and B, the Reset/Preset signal on Conductors 92, 110 and 112, preferably, should be applied to ACC. A and ACC. B and Counters A and B prior to the occurrence of the next succeeding Read Pulse on Conductor 154.

Figure 6:
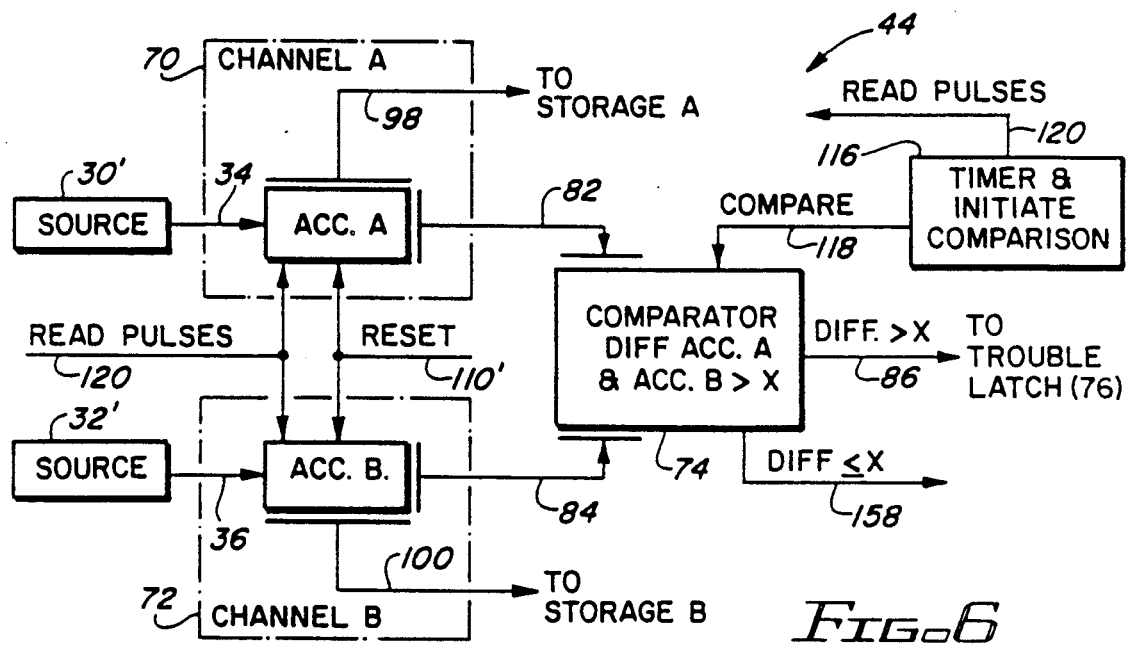
FIG. 6 is a schematic block diagram of an electric energy remote metering system illustrating redundant data channels in a recorder for detecting a system malfunction according to a further embodiment of the invention.
Figure 8:
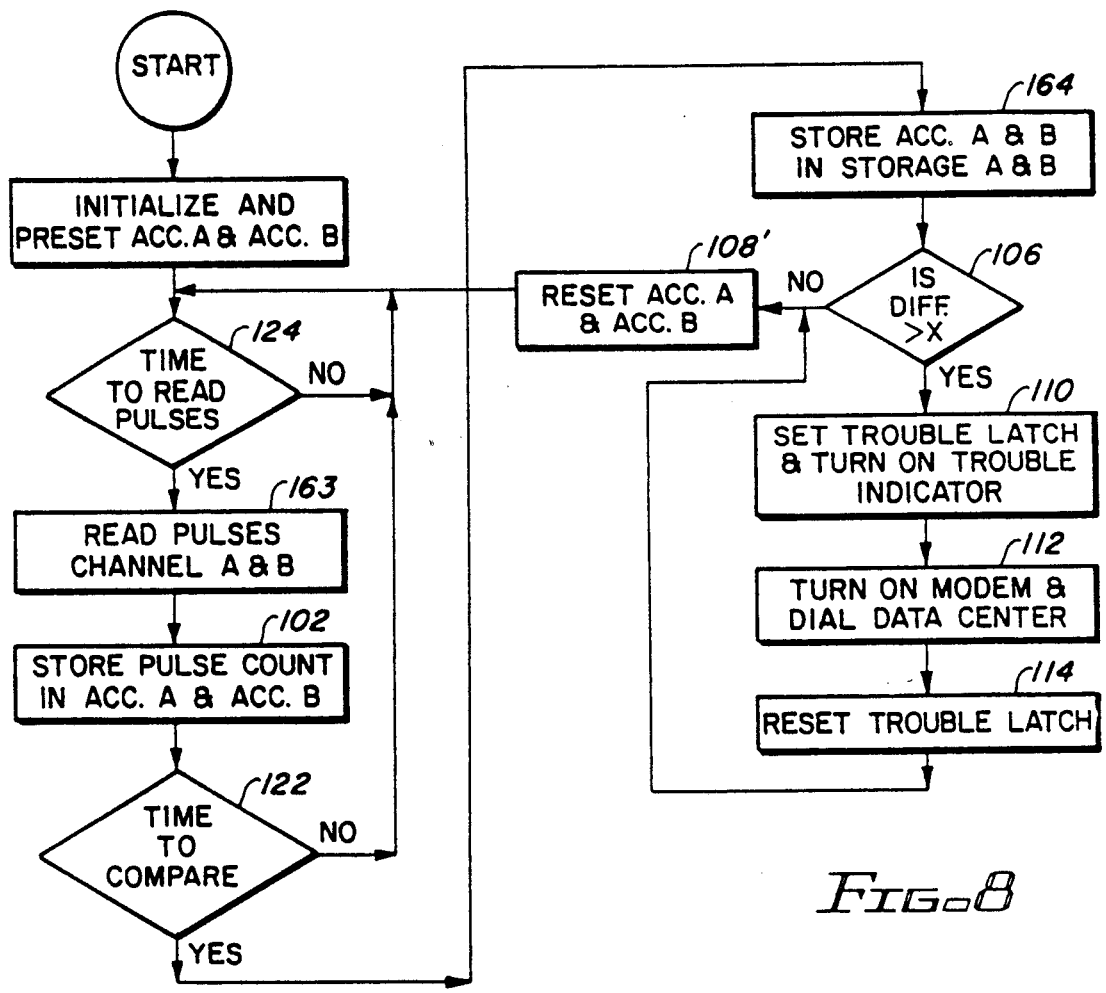

Reference is now made to FIGS. 6 and 8 which disclose a further embodiment of the invention. The structure and operation of FIGS. 6 and 8 is substantially the same as that described for FIGS. 5 and 7, but of simpler construction. It will be noted that Counters A and B have been eliminated in FIG. 6. In the embodiment of FIG. 6, a Timer and Initiate Comparison Circuit 116 is employed to provide a Compare signal on Conductor 118 to the Comparator 74. The length of time between Compare signals (i.e., comparison of the contents of ACC. A and ACC. B) is a matter of design choice. The Compare signal may be genreted recurrently, either periodically or at random intervals. One factor which determines the time between comparisons is the physical size of ACC. A and ACC. B. The time between comparisons should at least be frequent enough to prevent overflowing ACC. A and ACC. B. Another design choice which determines the frequency of comparison, is how frequently the designer or user desired to be notified, by indication or telephone call, of a system malfunction disrupting the accumulation of Sensor Pulses. Obviously, the longer the duration between comparisons, the greater the chances are of accumulating invalid Sensor Pulse data.

As previously mentioned, the operation of FIGS. 6 and 8 is substantially the same as FIGS. 5 and 7. For that reason, FIGS. 6 and 8 will not be described in detail. However, where differences exist, those differences are described immediately below.

It will be noted in FIG. 6 that the Timer and Initiate Comparison Circuit 116 generates Read Pulses on Conductor 120 to clock the Sensor Pulses into ACC. A and ACC. B in the same manner as described for FIG. 5.

The Initiate Comparison Circuit 116, which replaces Counters A and B in FIG. 5, generates the Compare signal on Conductor 118 at times, as previously described, to initiate the comparison in Comparator 74. This comparison initiation is shown in FIG. 8 in a Time To Compare decision Block 122. So long as a Compare Signal is not present on Conductor 118, the Read Pulses will continue to clock Sensor Pulses into ACC. A and ACC. B. This action is shown at the NO exit of Block 122, where the Recorder continues to re-enter the Time To Read Pulses decision Block 124.

When the Compare Signal on Conductor 118 is generated, it is time to compare the contents of ACC. A and ACC. B as shown in Block 122 of FIG. 8. The YES exit is then taken from Block 122 into a Block 164 wherein the contents of ACC. A and ACC. B are stored in Storages A and B. ACC. A and ACC. B are reset in Block 108' via the NO branch of Block 106 when there is no accumulation error. All subsequent operations of FIGS. 6 and 8 are the same as described for FIGS. 5 and 7.

Figure 10:
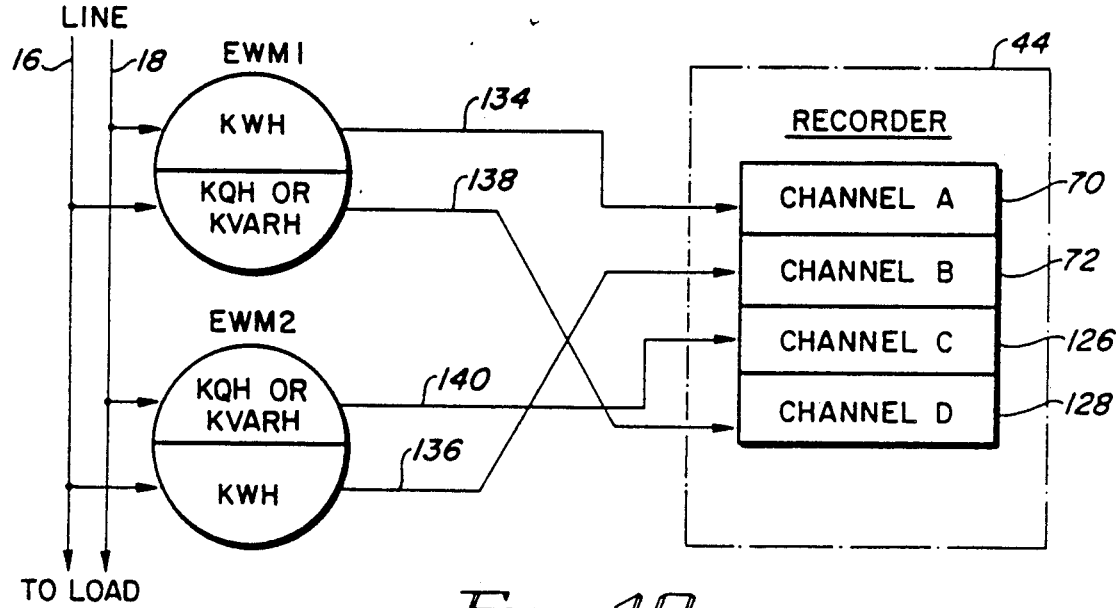
FIG. 10 is a simplified block diagram of an electric energy metering system, in accordance with the invention, illustrating electronic watthour meters for providing redundant pulses representative of different energy measures to a multi-channel recorder.

Refering now to FIG. 10 there is disclosed a further embodiment of the invention wherein two fully electronic watthour meters, designated EWM1 and EWM2, are connected to the Power Lines 16 and 18 to monitor the power consumed by a common load on the power lines. Meters EWM1 and EWM2 are each combination KWH and KQH or KWH and KVARH meters, each designed to measure two different electrical parameters. U.S. Pat. No. 4,556,843 discloses an electronic solid state combination Q-Hour (KQH) and Kilowatt hour (KWH) meter of the type suitable for use in the embodiment of FIG. 10 as EWM1 and EWM2. U.S. Pat. No. 4,556,843 is assigned to the assignee of the present invention.

As previously described, mechanical encoders of the type used in meters of the type described in the aforementioned U.S. Pat. No. 4,639,728 are unsuitable for use in electronic watthour meters such as EWM1 and EWM2. This is because there are no mechanical registers or dials in an electronic meter from which to construct a mechanical encoder. The present invention (as shown in FIG. 10) obviates the need for such mechanical encoders by providing redundant meter pulse data to two Channel Pairs comprised of Channels (70, 72) and (126, 128) of the Recorder 44. EWM1 and EWM2 each provide pulses proportional to a first measured electrical parameter, such as Kilowatt-hour (KWH) consumption to Channels A and B (70 and 72) via Lines 134 and 136. Pulses proportional to a second measured electrical parameter, such as either KVARH, or KQH, are provided to Channels C and D (126 and 128) from EWM1 and EWM2 via Lines 140 and 138.

As will subsequently be described, when dual function electronic watthour meters, such as EWM1 and EWM2, are used to generate pulses representative of different energy measures, the pulse comparison techniques employed by the invention not only serve to indicate the presence of a malfunction, but also to identify which electronic meter has failed and that portion of the meter which has failed. To this extent, the present invention serves as a diagnostic tool to identify which meter (e.g. EWM1 or EWM2) has failed and which part of that meter has failed (i.e. KWH portion or KQH or KVARH portion). As will hereinafter be described, this identification is made possible by utilizing Channels A and B as one Channel Pair to compare pulses of one type of power measurement (e.g. KWH) and Channels C and D as a second Channel Pair to compare pulses of a second type of power measurement (e.g. KQH or KVARH). A conventional watthour meter, such as Meter 10, can be used to replace either EWM1 or EWM2. This arrangement is useful when it is desireable to test the reliability of one of the meters, such as EWM1. When such an arrangement is used, it is generally only necessary to provide a single pulse source for generating the Sensor Pulses from each meter. For example, the Sensor Pulses to be accumulated from Meter 10 and EWM1 could be representative of KWHR consumption.

Figure 9:
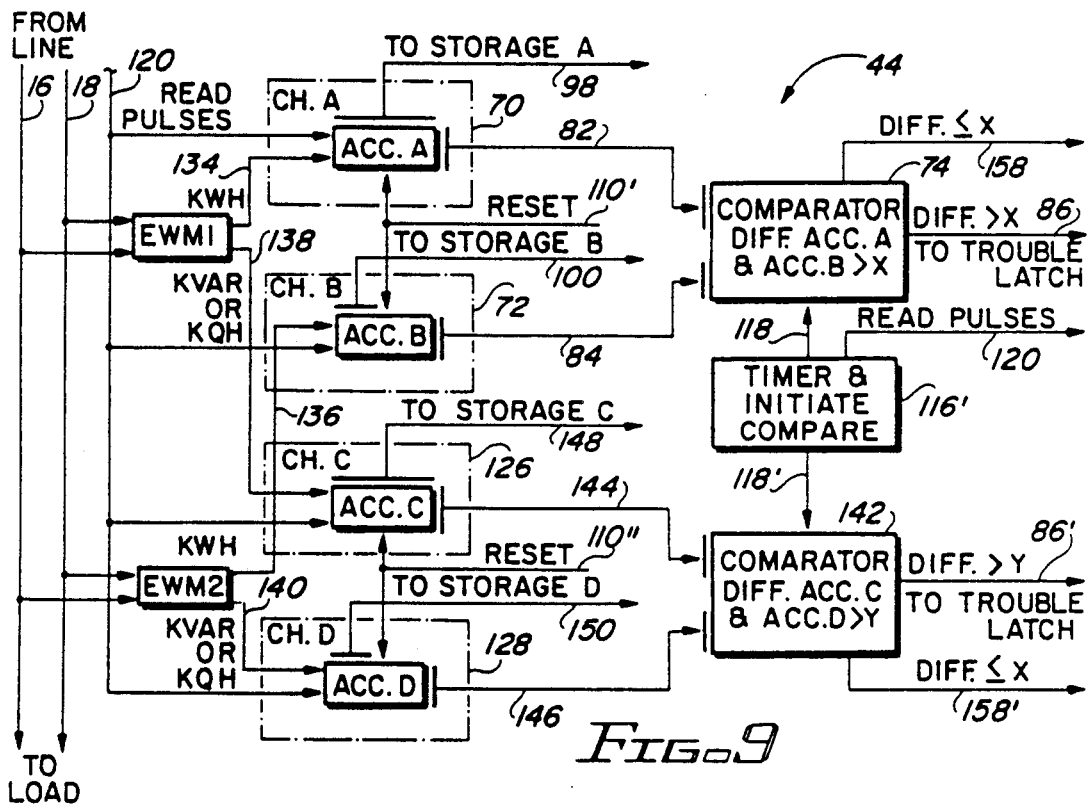
FIG. 9 is a schematic block diagram of an electric energy remote metering system illustrating electronic watthour meters as redundant pulse sources for providing pulses to a plurality of pairs of redundant data recording channels of a recorder according to the invention.

Reference is now made to FIG. 9, which discloses in greater detail the embodiment of FIG. 10. As can be seen in FIG. 9, the Recorder 44 is comprised of two comparator sections wherein one section includes Comparator 74 associated with Channels A and B (70 and 72) as one Channel Pair, and the other section includes a second Comparator 142 associated with Channels C and D (126 and 128) as a second Channel Pair. It will be noted that these Comparators 74 and 142 are each substantially the same Comparator 74 of FIG. 6. The Timer and Initiate Compare Circuit 116' of FIG. 9 is similar, to the Circuit 116 of FIG. 6, except that the Timer and Initiate Compare Circuit 116' provides the Compare signal on lines 118 and 118' to Comparators 74 and 142.

Still referring to FIG. 9, it will be noted that EWM1 and EWM2 provide redundant KWH pulses, via conductors 134 and 136 to ACC. A and ACC. B of Channels A and B respectively. The data outputs of ACC. A and ACC. B are also provided to Comparator 74, via Conductors 82 and 84 and storage outputs to Storages A and B are provided via Conductors 98 and 100 as previously described for FIG. 6.

In a fashion similar to that just described for Channels A and B, redundant KQH or KVARH pulses from EWM1 and EWM2 are provided, via Conductors 138 and 140 to ACC. C and ACC. D of Channels C and D respectively. The data outputs of ACC. C and ACC. D are provided to Comparator 142, via Conductors 144 and 146, whereas the storage outputs are provided, via Conductors 148 and 150, to Storages C and D associated with ACC. C and ACC. D respectively.

A detailed operational description of the embodiment of FIG. 9 is not believed necessary in view of the previous description given in connection with FIGS. 6 and 8. Each section of the Recorder of FIG. 9 (i.e. Channels A and B and Comparator 74 and Channels C and D and Comparator 142) operates substantially the same as previously described for FIGS. 6 and 8. However, to clarify the operation of FIG. 9 it is necessary to realize that the Compare signal on Conductors 118 and 118' is simultaneously applied to Comparators 74 and 142. If there is no error detected by either Comparator 74 or 142 at the time of the comparison, ACC. A-ACC. D are reset from the DIFF≦X signals one of the Lines 158 and 158' via Conductors 110' and 110''. Further, just as described in FIG. 8, when it is time for the comparison, ACC. A-ACC. D are simultaneously stored in Storages A-D. If either Comparator 74 or 142 detects an error at the time of the comparison, the Trouble Latch 76 is set, the Trouble Indicator 78 is turned on, and the Modem 80 initiates a telephone call. ACC. A-ACC. D are then reset in preparation for the next read cycle as previously described.

While not shown in FIG. 9, the invention contemplates a trouble latch and indicator (such as 76 and 78) for each channel of a channel pair. For example, there is a trouble latch connected to each of Conductors 86 and 86'. Thus, with two trouble latches and associated indicators, it is possible to identify a system failure in a channel pair by observation of the trouble indicator associated with the channel pair in which the error occurred. Further, it is possible to detect which portion of a meter (EWM1 or EWM2) has failed by retrieving the data stored in Storages A-D. For example, assume that an error is detected by Comparator 74 generating its DIFF≧X signal on Conductor 86 to set its associated latch and turn on that latch's associated indicator. It will be recalled that the contents of ACC. A and ACC. B are stored in Storages A and B. It will further be recalled that Storage A contains the KWH count from EWM1 and Storage B contains the KWH count from EWM2. Upon retrieval and observation of the contents of Storages A and B, it can be assumed that the storage with the smaller KWH count is that channel which created the error. For example, assume that ACC. A has accumulated fewer pulses than ACC. B, and as a consequence the total count in Storage A will be less than Storage B. Therefore, it can be assumed that the KWH section of EWM1 has failed. The same analogy can be used to diagnose a problem in the KQH or KVARH section of EWM1 and EWM2 by observation of Storages C and D.

The invention has heretofore been disclosed in its various hardware embodiments and in conjunction with the flow charts of FIGS. 7 and 8 describing the method steps of operation of those embodiments. As previously mentioned, the Electronic Recorder 44 of the present invention may be implemented by a stored program computer, such as shown by FIGS. 2-4 and 10. The invention, in its preferred embodiment, lends itself to such an implementation. This type of implementation not only provides a more economical recorder design, but also provides flexibility in the design to enable the recording and data processing of many channel pairs of redundant metering data from various types and combinations of meters and pulse sources.

Figure 11:
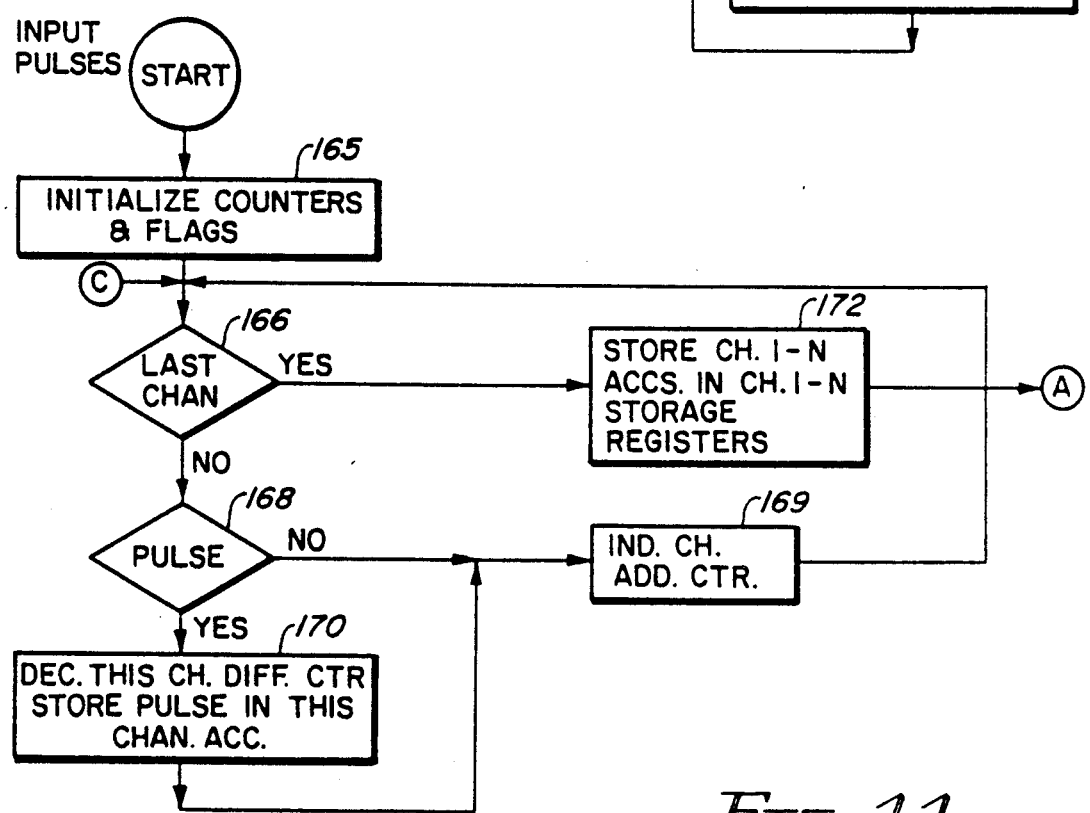
FIGS. 11-13 are simplified flow charts of a method of operating the programmed processor of the electronic data recorder of FIGS. 2-4 and 10 to control accumulation and storage of meter data, error testing of that data and error message generation.
Figure 12:
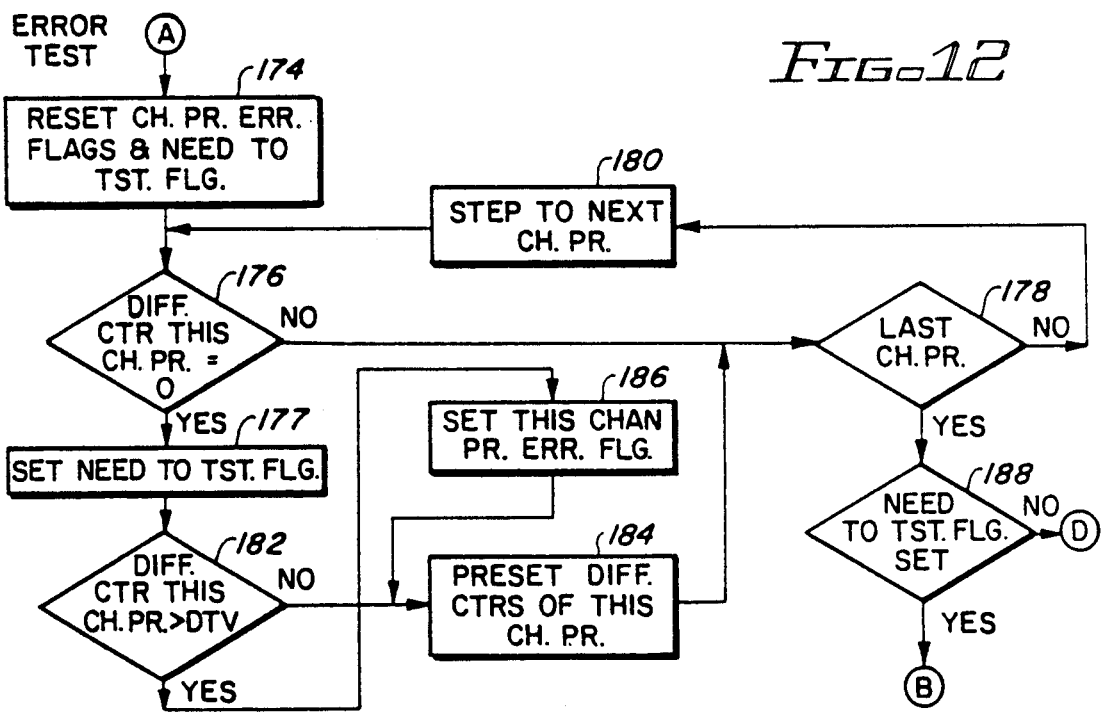
Figure 13:
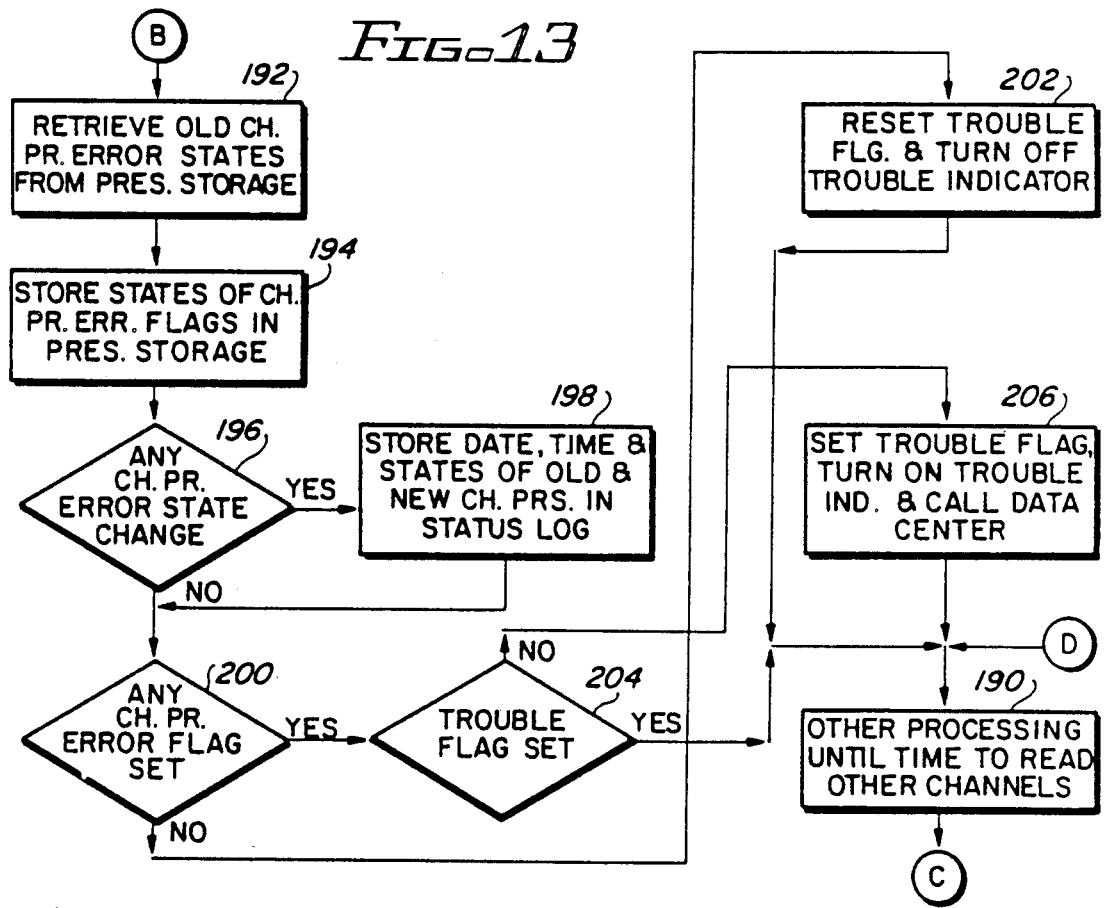

The above mentioned stored program embodiment of the invention is disclosed in the program flow charts of FIGS. 11-13. FIG. 14 is a memory map of the memory of the data processor or computer of the Recorder 44 showing the various accumulators, registers and other storage elements referred to in FIGS. 11-13 and is useful in understanding the operation of the invention. Prior to proceeding with a description of FIGS. 11-13, it is believed advantageous to provide a brief description of the memory map of FIG. 14.

Beginning at the top of FIG. 14 there is shown a Difference Trigger Value (DTV) which is a constant stored in memory. This constant DTV is substantially equivalent to the difference threshold value previously referred to in describing the Comparators, such as 79, in the previous embodiments. DTV is used to test for an error in any Channel Pair.

The next location is a constant and contains a count representative of the Number of Pulses To Trigger an Error Test. In the embodiment being described, a Channel Address Counter shown in FIG. 14 is incremented to address the data channels to read Sensor Pulses into the respective channels. The maximum count achieved by this counter is determined by the number of channels within the Recorder. Each time a channel is addressed, the contents of the Channel Address Counter are compared against the Number of Pulses To Trigger Error Test. If the Channel Address Counter is addressing the last counter in the recorder, the Number of Pulses To Trigger the Error Test will match the number in the Address Counter. This results in directing the computer to perform an error test.

The memory also contains a Difference Counter for each channel designated Channel 1 Difference Counter through Channel N+1 Difference Counter. It will be noted that adjacent channels, such as Channels 1 and 2, comprise a Channel Pair. In the present description Channels 1 and 2 are substantially equivalent to a Channel Pair comprised of Channels A and B as previously described, for example, in connection with FIGS. 5, 6 and 9.

The Recorder memory also contains a plurality of Channel Accumulators, one for each of the Channels 1 through N, for accumulating the Sensor Pulses received from the Sensor Devices.

The Recorder memory also contains a Storage Register for each of the Channels 1 through N. These Registers are utilized to accumulatively store the contents of their respectively associated accumulators in a manner as previously described in connection with the previous embodiments.

Following the Channel N Storage Register location, there is a memory location for retaining the Trouble Flag and a number of other flags used in the operation of the invention. The operation and use of these various flags will be subsequently described in connection with the description of FIGS. 11 through 13.

There is also shown in FIG. 14 a Preservation Storage area. This storage area is used to store and preserve, on a temporary basis, the error status of the various Channel Pairs, such as Channel 1 and 2 pair. The operation of the Preservation Storage area will become more clear in the ensuing description.

The memory also contains a plurality of System Status Error Logs. Each Status Error Log is in a separate memory location and contains the date, time and the new (or current) status and the old (or previous) status of each Channel Pair in the Recorder. The Systems Status Error Logs provide a historical record of the date, time and status of each Channel Pair. The information stored in these logs can be retrieved from the Recorder by a utility company. This information can be of value to the utilities. For example, if the Recorder reports an error, the data center can initiate a retrieval command and retrieve the Status Error Log information from the Recorder. By printing out this Status Error Log information, the utility can determine whether the status of a given Channel Pair which created the error is a new error or if it is a continuation of a previous or old error. There may be situations in the operation of the system where errors are created on a very temporary basis. Such errors are sometimes due to noise on a power line. These types of errors generally do not require investigation as they are considered self-correcting. However, if the status log of a given Channel Pair continues to show that an error exists in the old and new status locations, it is an indication of a continuous malfunction that may require immediate action to correct the problem causing the malfunction. A problem is generally diagnosed as temporary when the old status of a given Channel Pair shows an error, but the new status of that same Channel Pair shows that no error has occurred since the old status was recorded. Such an indication generally means that the entity which caused the error has corrected itself or that the problem causing the error was temporary.

The Recorder also contains its own calendar in the form of a Date and Time Register shown at the bottom of FIG. 14. This calendar is periodically updated in a well known fashion in the computer. The date and time from this register gets recorded into the date and time locations of the System Status Error Logs each time an entry is made into one of those logs.

Reference is now made to FIG. 11 which shows a simplified flow chart of an Input Pulses sub routine of the present invention which reads the Sensor Pulses of the various redundant Sensor Devices into each of the Recorder Channels.

The Input Pulses sub routine starts by entering into an Initialize Counters and Flags Block 165 wherein the Channel Difference Counters $1-N+1$ are preset to a predetermined count. Also, the Channel Accumulators $1-N$ and Error Status Channel Pair flags in the Preservation/Storage are reset and the System Status Error Logs are cleared. After initialization the program enters into a decision Block 166 wherein a test is performed to see if the last channel has been read. As previously described, this test is performed by comparing the Number of Pulses to Trigger Error test with the contents of the Address Channel Counter. Let it now be assumed that the last channel has not been read. As a result, the program will exit the N branch into a decision Block 168 wherein a test is performed to see if a Sensor Pulse is present on the channel presently being addressed. If no pulse is present, exit from Block 168 is through the N branch into an action Block 169 wherein the Channel Address Counter is incremented by one and the program returns back to the entry point of the Last Channel Block 166. If no pulse is present, no pulse will be recorded in that particular channel being addressed.

The program will now proceed through blocks 166 and 168 as just described. Let it now be assumed, in the Block 168, that a Sensor Pulse is present on the input to the channel being addressed. As a result, the program exits through the Y branch into an action Block 170. Since a Sensor Pulse is present at the input to the channel now being addressed, the Difference Counter for that channel is decremented by 1 and the Sensor Pulse is stored in the Accumulator of the addressed channel. Exit is now made from Block 170 into Block 169 wherein the Channel Address Counter is again incremented. The operation just described will be repeated until all channels have been tested for the presence of a Sensor Pulse. Let it now be assumed in Block 166 of FIG. 11 that the last channel has been addressed. The program will now exit through the Y branch of Block 166 into an action Block 172. In Block 172 the program stores the contents of all of the Channel 1 through N Accumulators into corresponding ones of the Channels 1 through N Storage Registers of the memory of FIG. 14. The data from Accumulators 1 through N is now preserved in Storage Registers 1 through N for further analysis by the utilities to enable them to be able to reconstruct any lost data which may have not been recorded during the Input Pulses sub routine of FIG. 11. The program now exits Block 172 to a Connector A entering into FIG. 12 into an action Block 174.

FIG. 12 is an Error Test sub routine wherein the computer of the Recorder tests to see if either one of the Difference Counters of each channel pair is greater than DTV (See FIG. 14).

The first action to take place upon entry into the Error Test sub routine in Block 174 is to reset all of the Channel Pair Error Flags as previously described for FIG. 14 and set a Need To Test Flag. The purpose of the use of these flags will become apparent in the following description.

The program now proceeds into a decision Block 176 wherein a test is performed to see if the Difference Counter of either channel in the current Channel Pair (e.g. Channels 1 and 2 pair) is equal to 0. If neither Difference Counter is equal to 0, exit is through the N branch of Block 176 into another decision Block 178.

In decision Block 178 the program tests to see if the last Channel Pair (i.e., Channels N and N+1 pair) has been tested. Let it be assumed that the last channel of the last Channel Pair has not been tested. As a result, exit from Block 178 is through the N branch into an action Block 180 wherein the Address Counter is incremented to address the next Channel Pair. The program will now re-enter back into Block 176. The program will continue to loop through Blocks 176, 178 and 180 until one of the Difference Counters of a Channel Pair (Block 176) achieves a count of 0 or, as shown in Block 178, until the last Channel Pair has been tested.

Referring again to Block 176, let it now be assumed that one of the Difference Counters of one of the channels in a Channel Pair achieves a count of 0. As a result, exit from Block 176 is through the Y branch into another action Block 177 wherein the Need To Test Flag in the memory of FIG. 14 is set. This test flag will be utilized at a later time in Block 188 to direct the program to either enter into an Error Handler sub routine of FIG. 13 or exit the sub routine of FIG. 12.

With the Need To Test Flag now set (Block 177), the program enters into a decision Block 182 wherein a test is performed to see if the Difference Counter of either channel of the present Channel Pair is greater than DTV. If neither Difference Counter is greater than DTV, exit is made from Block 182 through its N branch into another action Block 184. Entry into Block 184 is an indication that no error has occurred on either channel of the present Channel Pair. As a result, the two Difference Counters of the present Channel Pair are preset to a prescribed count in preparation to reading data into that Channel Pair on the next read cycle. The program will now exit Block 184 and re-enter into Block 178 wherein the test is again performed to see if the last Channel Pair has been tested as previously described.

Reference is now made back to Block 182. Let it now be assumed that an error has been detected in one of the Difference Counters of the present Channel Pair. As a result, exit from Block 182 is through its Y branch into an action Block 186. In Block 186, the Channel Pair Error Flag for the present Channel Pair is set. For example, referring to FIG. 14, if an error has occurred on the Channel Pair comprised of Channels 1 and 2, the Error Flag for Channels 1 and 2 Pair will be set. After the Channel Pair Error Flag is set in Block 186, the program then proceeds into Block 184 wherein the Difference Counters of the present Channel Pair are preset in preparation to the next read cycle as previously described.

Let it now be assumed that the program has looped through the Error Test sub routine of FIG. 12 in the manner as just described until the last Channel Pair has been tested.

Reference is now made back to Block 178. It will be recalled that in Block 178 a test is performed to see if the last Channel Pair in the Recorder has been tested. After all channels have been tested, and the errors recorded as previously described, exit will be through the Y branch of Block 178 into another decision Block 188. In Block 188 a test is performed to see if the Need To Test Flag has been previously set. It will be recalled that the Need To Test Flag (Block 177) is set via the Y branch of Block 176 whenever one of the Difference Counters of either channel of a Channel Pair achieves the count of 0. This Need To Test Flag is utilized to direct the program to exit via either its Y branch (Connector B) or its N branch (Connector D).

If the Need To Test Flag is not set, it is an indication that none of the Difference Counters of any channel of any Channel Pair has achieved the count of 0. If no error is detected, there is no need to perform the Error Handler sub routine of FIG. 13. The reason for this is because there is no need to update the System Status Error Logs if there is no error to be recorded. Let it now be assumed in Block 188 that the Need To Test Flag is not set. Thus, exit is through the N branch to a Connector D of FIG. 13 entering into a Block 190. Block 190 is a processing block of other processing routines (not shown) which may be executed by the computer of the Recorder until it is time to read the channels again. As previously described, an optimum time to read the various channels of the present invention preferably should occur approximately every 6 milliseconds. As a result, the execution of these other processing routines can continue for slightly less then a 6 millisecond period, at which time the Recorder is directed to re-enter the Program at Connector C of FIG. 11. As shown in FIG. 11 Connector C provides entry in to Block 166 wherein program execution is carried out as previously described.

Reference is now made back to the decision Block 188 of FIG. 12. Let it now be assumed that the Need To Test Flag has been set. With this Test Flag set, it is an indication that at least one Difference Counter of at least one Channel Pair has achieved the count of 0 as previously described in connection with Block 176. As a result, the program will exit through the Y branch of decision Block 188 entering into a Connector B of the Error Handler sub routine of FIG. 13.

The purpose of the Error Handler sub routine of FIG. 13 is to update the System Error Status Logs for each Channel Pair, set the Trouble Flag, turn on the Trouble Indicator and call the data center when a new error has occurred in any Channel Pair.

Entry into Connector B is at an action block 192. However, prior to describing the operation of Block 192 and subsequent blocks in FIG. 13, it is considered advantageous to first describe those portions of the memory map of FIG. 14 which are used by the Error Handler sub routine of FIG. 12. It will be recalled in FIG. 12 that a Channel Pair Error Flag is set in Block 186 any time that there is an error detected on any channel of a Channel Pair. It will also be recalled that there is an error flag for each Channel Pair. These Channel Pair Error Flags always contain the current or immediate error status of each Channel Pair. The present invention also stores the old or previous error status of each Channel Pair in the System Status Error Logs as previously described. The System Status Error Logs also store the new or current status of each Channel Pair. The invention continuously updates the status of each Channel Pair. That is, the new and old status of each Channel Pair is continuously updated in the System Status Error Logs each time the Error Handler sub routine of FIG. 13 is entered. In order to accommodate the updating of the System Status Error Logs the Preservation Storage area has been provided. The Preservation Storage area is temporary storage area having an Error Status Channels error flag for each Channel Pair. These flags always contain the old or previous error status for each Channel Pair. At system initializiation the Preservation Storage area is always initialized to zero. The method of updating the Preservation Storage area will be described in the following description of FIG. 13.

Reference is now made back to Block 192 FIG. 13. In that Block it will be noted that the processor now retrieves the old Channel Pair Error Flag States or status from the Preservation Storage area. Obviously, the contents of the Preservation Storage area will be 0 upon the first entry into FIG. 13. After retrieving the Old Channel Pair Error States from the Preservation Storage, the program now enters into another action Block 194 wherein the states of those Channel Pair Error Flags, which were previously set in Block 186 of FIG. 12, are stored in corresponding Channel Pair error flag locations in the Preservation Storage area. The Preservation Storage area is used as the previous or old channel pair status upon each entry into the Error Handler sub routine. Exit is now made from Block 194 into a decision Block 196. In that Block a test is performed by testing the states of the just retrieved Old Channel Pair Error States from Preservation Storage with the corresponding Channel Pair States of the Channel Pair Error Flags previously set in Block 186. If there has been any change in the Channel Pair Error States between the old and the new states, exit is made through the Y branch of Block 196 into an action Block 198. In Block 198, the date and time (from the Date and Time Register FIG. 14), and the states of the old Channel Pair States (i.e., previously retrieved Preservation Storage Area States) and the states of the new Channel Pair Error Flags are stored in their respective locations in the System Status Error Logs as shown in FIG. 14. Thus, the System Status Error Log is updated to reflect the new and old status for each Channel Pair. Entry is now made into a decision Block 200 wherein a test is performed to see if any Channel Pair Error Flag was previously set (see Block 186, FIG. 12). If no Channel Pair Error Flag is set, exit from Block 200 is through its N branch into action Block 202.

In Block 202 the program now resets the Trouble Flag and turns off the Trouble Indicator, if the Trouble Flag had been previously set. The program then exits from Block 202 re-entering into Block 190 wherein the processor continues to perform additional processing until time to read the input channels as previously described by re-entering from Block 190 into Connector C of FIG. 11.

Referring back to Block 200, let it now be assumed that at least one Channel Pair Error Flag was set during the last read cycle (see Block 186, FIG. 12). As a result, exit from Block 200 is through its Y branch into a decision Block 204 wherein the state of the Trouble Flag is tested to see if it is set. The reason for testing the Trouble Flag at this time is to minimize the number of telephone calls that the Recorder initiates to the data center. This is accomplished by setting the Trouble Flag and initiating only one telephone call to the data center when an error is detected in one of the Channel Pairs. If the Trouble Flag had already been set on a previous pass through FIG. 13, a telephone call would have been initiated during that pass. Thus, on the next pass through FIG. 13, if the Trouble Flag is set, it is not desirable to initiate another telephone call. If the Trouble Flag is set, exit will be made through the Y branch of Block 204 and re-entry will be made back into Block 190.

Still referring to Block 204, let it now be assumed that the Trouble Flag is not set. As a result, exit is made through its N branch into a Block 206. Entry into this Block is an indication that there was an error on the last read cycle and that there was no error detected on the read cycle preceding the last read cycle. Thus, in Block 206, the Trouble Flag is set. The Trouble Flag also turns on the Trouble Indicator and initiates a telephone call to the data center via the Modem in the manner previously described. The program then exits Block 206 and re-enters into Block 190, wherein the computer will continue to do other processing until time to read the data channels as previously described.

In view of the foregoing description it can now be seen how the memory of FIG. 14 of the present invention always contains sufficient information to enable a utility to retrieve information from the memory 14 and verify the validity of the data stored in that memory. It will be recalled that the contents of the Channel 1 through N Accumulators are continuously stored in Channel 1 through N Storage Registers. Thus, these Storage Registers always contain the accumulated information retrieved from their variously associated accumulators. This information can be retrieved by a utility's data center for diagnosis and by comparing the contents of the Storage Registers of each Channel Pair a determination can be made as to which of those Storage Registers contains valid data. For example, if the Storage Registers associated with Channel 1 and 2 Channel Pair are compared in the data center, and if the pulse count stored in the Storage Register of Channel 1 is less than the pulse count stored in the Storage Register of Channel 2, the utility can assume that an error occured on one of the channels. By inspection of data from both channels it will frequently be evident which channel is aberrant, permitting the utility to bill on the other channel data without having to estimate the bill to the customer.

In addition, the invention also contains in the memory of FIG. 14 a complete System Status Error Log for each Channel Pair. There is a Status Error Log location in the memory for recording the date, time and the new and the old status of each Channel Pair each time an error is detected by the program. Thus, by retrieving this information, a utility can obtain a printout at the data center showing the date and time of each error which occurred in the system and also the old and new error status of each Channel Pair where the error occurred. This information can be used by a utility to determine whether to immediately visit the site of the Recorder and the meters to correct a potential problem or defer such a visit. For example, by comparing the status of the new and the old Channel Pairs a determination can be made as to whether a problem exists in the system which is creating a continuous recording error in the system or if the problem is merely intermittent and possibly self-correcting.

In summary, there has been described an electricity energy metering and recording system comprised of a plurality of independently operable sensing devices, pulse initiators and electronic registers for providing combinations of redundant pulses representative of substantially duplicate independent measures of metered energy usage to a multi-channel recorder. The recorder includes means for recording and testing the redundant pulses as pulse counts in channel pairs to assist the user of the system in diagnosing and isolating a system malfunction disrupting the recording of pulses being provided to the channels of each channel pair.

Redundant meter data is preserved for each channel pair to provide backup data for verification purposes to assist a utility in preparing customer bills based on actual energy usage, instead of estimated usage drawn from customer historical usage records.

System reliability is enhanced by providing combinations of independent power sources and power supplies for separately powering the recorder and pulse sources (e.g. sensing devices), pulse initiators and electronic registers. Such powering makes the recorder and the sources generating the redundant pulses each at least partly independently operable to prevent the total loss of the meter data which gets recorded in redundant channels of each Channel Pair. There has also been described a solid state computerized data recording device to be installed at a meter site to monitor energy consumption measured by an electricity meter such as an electronic watthour meter, or induction type watthour meter with an electronic register, or pulse initiator or similar instrument. Redundant Sensor Pulses developed by combinations of standard watthour meters, pulse initiators, sensing devices, electronic registers and electronic watthour meters are accumulated and stored as pulse counts in redundant channels (as channel pairs) in a multi-channel recorder to be transmitted to a central computer or data center for meter reliability testing and analysis and for survey and billing purposes. The pulse counts accumulated by each channel pair are recurrently compared (i.e. either periodically or at random intervals). If the comparison yields a value which falls within a predetermined threshold value, the pulse counts are deemed verified. If the comparison yields a value greater than the predetermined threshold value, one of the pulse counts is deemed to be in error, and thus invalid. If the comparison yields an error, the recording device creates a status error log for that channel pair, turns on a trouble indicator and initiates a phone call to the data center as an indication that a system malfunction has created an error in the meter data recorded in that channel pair where the error occurred.

The invention also eliminates the need for mechanical dial encoders. As a result, the processing of recorder data and the prompt detection of pulse accumulation errors is expedited by eliminating the time consuming task of having to continuously read the meter dial encoders. In the present invention, monitoring of meter pulse data is continuous and the time lapse between intervals for the testing of pulse accumulation errors is limited only by design choice as to how frequent such testing is to be performed.

It will be apparent that the embodiments shown and disclosed herein are only exemplary, and that various modifications can be made that are within the scope of the invention as defined in the following claims.

What is claimed is:

1. In a system of the type including an electricity meter for metering electric energy usage by a load, apparatus for recording verifiable energy usage data, comprising:
    (a) first pulse means in communication with said electricity meter for generating first pulse signals;
    (b) second pulse means in communication with said electricity meter for generating second pulse signals, said first and second pulse signals being representative of substantially duplicate independent measures of the energy usage by said load;
    (c) first and second accumulating means for accumulating said first and second pulse signals as first and second pulse counts respectively, each having a value substantially proportional to energy usage by said load; and
    (d) means, in communication with said first and second accumulating means, for periodically verifying said first and second pulse counts and, in response to the verifying, providing an indication of a system abnormality when there is a difference in the values of said first and second pulse counts.

2. The system in accordance with claim 1, wherein said means for periodically verifying includes means for comparing the values of said first and second pulse counts and providing an indication of a system abnormality when the difference between the values of said first and second pulse counts exceeds a predetermined threshold value.

3. The system in accordance with claim 2 further including means in communication with said means for comparing for initiating a telephone call to a data center as an indication of a system abnormality disrupting the accumulation of either one of said first and second pulse signals.

4. The system in accordance with claim 1, wherein said electricity meter includes a rotatably mounted apertured disc which rotates at a rate proportional to electric energy usage by said load and said first and second pulse means are each photo electric light sensing devices for sensing light through apertures in the rotating disc to generate said first and second pulse signals.

5. The system in accordance with claim 4 wherein each of said photo electric sensing devices is energized from a separate electrical power source.

6. A system for recording verifiable energy usage data from a remote electricity meter of the type having a disc which rotates at a rate proportional to the amount of electric energy being consumed by a load connected to the meter, comprising:
(a) first pulse means in said meter for sequentially generating first pulse signals in response to rotation of said disc;
(b) second pulse means in said meter, independently operable from said first pulse means, for sequentially generating second pulse signals in response to rotation of said disc, said first and second pulse signals being representative of substantially duplicate independent measures of the electric energy consumed by said load;
(c) first accumulating means for accumulating said first pulse signals as a first pulse count having a value proportional to electric energy consumption by said load;
(d) second accumulating means for accumulating said second pulse signals as a second pulse count having a value proportional to electric energy consumption by said load; and
(e) means in communication with said first and second accumulating means for verifying said first and second pulse counts by recurrently comparing the values thereof and providing an indication of a system abnormality and initiating a telephone call to a data center when the difference between the values of said first and second pulse counts exceeds a predetermined threshold value.

7. The system in accordance with claim 6 wherein said disc contains at least one aperture therein and said first and second pulse means are each photo electric light sensing devices for sensing light through the at least one aperture in the rotating disc to generate said first and second pulse signals.

8. The system in accordance with claim 7 wherein each of said photo electric sensing devices is energized from a separate electrical power source.

9. In an electricity metering and recording system, apparatus for preventing the loss of recorded electrical energy usage data and promptly providing an indication of a system malfunction which interrupts the proper recording of such electrical energy usage data, comprising:
(a) a meter for metering electrical energy usage by a load connected to said meter, said meter including a pulse source for generating first and second pulse signals, said first and second pulse signals being representative of substantially duplicate independent measures of the electrical energy usage by said load;
(b) first and second recording channels, responsive to said first and second pulse signals respectively, for accumulating and storing first and second pulse counts respectively, each having a value substantially proportional to electrical energy usage by said load; and
(c) means, including processor means, in communication with said first and second recording channels for recurrently comparing said first and second pulse counts and providing an indication representative of a malfunction in said electricity metering and recording system when the difference between the values of said first and second pulse counts exceeds a predetermined threshold value.

10. The system in accordance with claim 9 wherein said pulse source includes independently operable first and second pulse means for generating said first and second pulse signals.

11. The system in accordance with claim 10 wherein said meter further includes a rotatably mounted apertured disc which rotates at a rate proportional to electric energy usage by said load and said first and second pulse means are each photo electric light sensing devices for sensing light through the apertures in the rotating disc to generate said first and second pulse signals.

12. The system in accordance with claim 11 wherein each of said photo electric sensing devices is energized from a separate electrical power source.

13. In an electricity metering system, apparatus for providing an indication of a system malfunction comprising:
(a) a meter for metering electric energy usage by a load, said meter including independently operable first and second pulse means for generating first and second pulse signals respectively, said first and second pulse signals being representative of substantially duplicate independent measures of the energy usage by said load;
(b) first accumulating means, responsive to said first pulse signals, for accumulating a first pulse count having a value proportional to said energy usage;
(c) second accumulating means, responsive to said second pulse signals, for accumulating a second pulse count having a value proportional to said energy usage;
(d) timer means for recurrently generating a comparison signal; and
(e) means, in communication with said timer means and said first and second accumulating means, responsive to the comparison signal from said timer means, for comparing said first and second pulse counts and providing an indication representative of a malfunction in the electricity metering system when the difference between the values of said first and second pulse counts exceeds a predetermined threshold value.

14. In an electricity metering system, apparatus for accumulating backup energy usage data and providing an indication of an abnormality in the operation of the system, comprising:
(a) a meter for metering electrical energy usage by a load, said meter including pulse source means for redundantly generating first and second pulse signals, each representative of a substantially duplicate independent measure of the electrical energy usage by said load;
(b) first and second accumulating means, responsive to said first and second pulse signals respectively, for accumulating redundant first and second pulse counts;
(c) first and second storage means, in communication with said first and second accumulating means respectively, for storing redundant backup energy usage data;
(d) means, in communication with said first and second accumulating means, for recurrently comparing said first and second pulse counts and providing an indication representative of an abnormality in the operation of the electricity metering system when the difference between said first and second pulse counts exceeds a predetermined threshold value; and (e) means, in communication with said means for recurrently comparing, for resetting each of said first and second accumulating means following each comparison of said first and second pulse counts.

15. A system for accumulating redundant electrical energy usage data comprising:

(a) a meter for metering electrical energy usage consumed by a load connected to said meter, said meter including first and second pulse means for generating first and second pulse signals respectively, each representative of a substantially duplicate independent measure of the energy usage by said load;

(b) first and second power sources for providing energizing current to each of said first and second pulse means respectively; and (c) an electronic recorder including first and second channels for receiving said first and second pulse signals respectively, each of said first and second channels adapted to accumulate and store a corresponding one of said first and second pulse signals as first and second pulse counts respectively, each having a value proportional to a substantially duplicate independent measure of the energy usage by said load, said electronic recorder further including means for recurrently comparing the values of said first and second pulse counts and providing an indication representative of a system abnormality disrupting the proper accumulation of either of said first and second pulse signals in said first and second channels respectively when the difference between the values of said first and second pulse counts exceeds a predetermined threshold value.

16. In a system of the type including a meter connected to a power line for metering electrical energy usage by a load connected to the meter, the combination comprising:

(a) pulse source means in said meter for generating redundant first and second pulse signals respectively, said first and second pulse signals each being representative of a substantially duplicate independent measure of the energy usage by said load;

(b) a recorder including, (i) first and second channels for receiving said first and second pulse signals respectively, said first and second channels each adapted to accumulate and store its respectively received first and second pulse signals as first and second pulse counts, each having a value proportional to a substantially duplicate independent measure of said energy usage by said load; and (ii) timer means for recurrently generating a comparison signal; and (iii) means, in communication with said timer means and said first and second channels, and responsive to said comparison signal from said timer means, for comparing the values of said first and second pulse counts and providing an indication of a system abnormality when the difference between the values of said first and second pulse counts exceeds a predetermined threshold value.

17. In a power distribution system of the type including a meter for metering electrical energy usage by a load, the combination comprising:

(a) pulse source means in said meter for generating redundant first and second pulse signals, each representative of a substantially duplicate independent measure of the electrical energy usage by said load;

(b) an electronic register in said meter responsive to said first pulse signals for monitoring electrical energy usage, said electronic register including pulse initiator means for generating third output pulse signals substantially proportional to the measure of electrical energy usage as represented by said first pulse signals; and (c) a recorder, said recorder including first and second data channels for receiving said second and third pulse signals respectively, said first and second data channels each including means for accumulating its respectively received one of said second and third pulse signals as first and second pulse counts, said recorder further including means in communication with said first and second data channels for recurrently initiating a comparison of said first and second pulse counts, and providing a detectable indication that a system abnormality disrupting the normal accumulation of one of said second and third pulse signals has occurred when the difference between the values of said first and second pulse counts exceeds a predetermined threshold value.

18. The system in accordance with claim 17 wherein said pulse source means includes first and second independently operable pulse means for generating said first and second pulse signals.

19. The system in accordance with claim 18 wherein said meter further includes a rotatably mounted apertured disc which rotates at a rate proportional to electric energy usage by said load and said first and second pulse means are each photo electric light sensing devices for sensing light through the apertures in the rotating disc to generate said first and second pulse signals.

20. The system in accordance with claim 19 wherein each of said photo electric sensing devices is energized from a separate electrical power source.

21. The system in accordance with claim 17 wherein said pulse source means, said electronic register and said recorder are each energized from a separate electrical power source.

22. The system in accordance with claim 17 wherein each of said pulse source means, said electronic register and said recorder contains its own power supply.

23. The system in accordance with claim 17 wherein said pulse source means includes first and second independently operable pulse means for generating said first and second pulse signals, and each of said electronic register and said recorder contains an integral power supply, the electronic register power supply providing energizing current to said first pulse means and the recorder power supply providing energizing current to said second pulse means.

24. In a system of the type including a meter connected to a power distribution line for metering electrical energy usage by a load connected to the meter, the combination comprising:

(a) first and second pulse means in said meter for generating first and second pulse signals respectively, said first and second pulse signals each being representative of a substantially duplicate. independent measure of the electrical energy usage by said load;

(b) an electronic register in said meter, said electronic register including a power supply for providing operating voltages for said electronic register and for said first pulse means, said electronic register being responsive to said first pulse signals and including means for generating third pulse signals representative of the measure of electrical energy usage represented by said first pulse signals;

(c) a recorder including,
  (i) a power supply for providing operating voltages for said recorder and for said second pulse means,
  (ii) first and second data channels for receiving said second and third pulse signals respectively, said first and second data channels each including means for accumulating their respectively received second and third pulse signals as first and second pulse counts, each having a value proportional to a substantially duplicate independent measure of the electrical energy usage by said load, and
  (iii) means for recurrently comparing said first and second pulse counts and providing an indication of a system malfunction causing a disruption in the generation of a one of said first, second and third pulse signals when the difference between the values of said first and second pulse counts exceeds a predetermined threshold value; and (d) means for energizing the power supply in each of said electronic register and said recorder.

25. The system according to claim 24 wherein said means for energizing includes a separate power source for energizing the power supply in each of said electronic register and said recorder.

26. In a system of the type including a meter connected to a power line for metering electrical energy usage by a load connected to the meter, the combination comprising:

(a) first and second pulse means in said meter for generating first and second pulse signals respectively, said first and second pulse signals each being representative of a substantially duplicate independent measure of the energy usage by said load, said first and second pulse means each including a power supply for providing operating voltages therefor, (b) a recorder including,
  (i) a power supply for providing operating voltages for said recorder,
  (ii) first and second channels for receiving said first and second pulse signals respectively, said first and second channels each adapted to accumulate their respectively received first and second pulse signals as first and second pulse counts, each having a value proportional to a substantially duplicate independent measure of the energy usage by said load,
  (iii) means for recurrently comparing said first and second pulse counts and providing an indication of a system abnormality causing a disruption in the accumulation of one of said first and second pulse signals when the difference between the values of said first and second pulse counts exceeds a predetermined threshold value; and (c) means for energizing the power supply in each of said recorder and said first and second pulse means.

27. The system according to claim 26 wherein said means for energizing includes a separate power source for energizing the power supply in each of said recorder and said first and second pulse sources.

28. In a system of the type including a meter connected to a polyphase power line for metering electrical energy use by a load connected to the meter, the combination comprising:

(a) first and second pulse means in said meter for generating first and second pulse signals respectively, said first and second pulse signals each being representative of a substantially duplicate independent measure of the energy usage by said load;

(b) an electronic register in said meter, said electronic register including a power supply for providing operating voltages for said electronic register and for said first pulse means, said electronic register being responsive to said first pulse signals and including means for generating third pulse signals representative of the measure of the electrical energy usage represented by said first pulse signals, (c) a recorder including,
  (i) a power supply for providing operating voltages for said recorder and for said second pulse means,
  (ii) first and second channels for receiving said second and third pulse signals respectively, said first and second channels each including means for accumulating their respectively received second and third pulse signals as first and second pulse counts, each having a value proportional to a substantially duplicate independent measure of the electrical energy usage by said load,
  (iii) means for recurrently comparing said first and second pulse counts and providing an indication of a system abnormality causing a disruption in the accumulation of a one of said first, second and third pulses when the difference between the values of said first and second pulse counts exceeds a predetermined threshold value; and (d) means connecting the power supply in each of said electronic register and said recorder to a separate phase of said polyphase power line whereby each power supply is separately energized from said polyphase power line.

29. In a system for accumulating energy usage data from a remote electricity meter, the combination comprising:

(a) a pulse source means in said meter for generating first and second pulse signals, said first and second pulse signals being representative of substantially redundant independent measures of the energy usage;

(b) pulse initiator means, responsive to said first pulse signals, for generating third pulse signals related to said first pulse signals, said pulse initiator means including power supply means for providing energizing current for said pulse initiator means and for said pulse source means;

(c) an electronic recorder, including means for accumulating said second and third pulse signals as redundant first and second pulse counts, each having a value substantially proportional to an independent measure of energy usage, means for recurrently comparing said first and second pulse counts and providing an indication of an abnormality in the system disruption the normal accumulation of said second and third pulse signals when the difference between the values of said first and second pulse counts exceeds a predetermined threshold value, said electronic recorder further including power supply means for providing energizing current therefor; and (d) means for providing power to the power supply means in each of said pulse initiator means and said electronic recorder.

30. In a power distribution system, apparatus for metering electric energy usage by a load comprising:

(a) first and second pulse means for generating first and second pulse signals respectively, said first and second pulse signals being representative of substantially duplicate independent measures of the electric energy usage by said load;

(b) first and second counter means for counting said first and second pulse signals respectively;

(c) first and second accumulator means for accumulating said first and second pulse signals respectively;

(d) first and second storage means for storing said first and second pulse signals respectively as redundant backup energy usage data;

(e) comparator means in communication with said first and second counter means and said first and second accumulator means for comparing the contents of said first and second accumulator means upon either of said first and second counter means achieving a prescribed count, said comparator means further including means for generating a trouble signal indicative of a system abnormality affecting the normal accumulation of said first and second pulse signals when the difference between the contents of said first and second accumulator means exceeds a prescribed value; and (f) means for providing a reset signal to said first and second counter means and said first and second accumulator means, following the comparing by said comparator means.

31. In a system of the type for recording electrical energy usage data from a remote site, the combination comprising:

(a) a meter for metering electrical energy consumed by a load at said remote site, said meter including pulse source means for generating first and second pulse signals, said first and second pulse signals being representative of substantially redundant independent measures of the electrical energy consumed by said load;

(b) a recorder in communication with said meter for recording said first and second pulse signals, said recorder including, (i) means for signaling of the presence of a system abnormality affecting the normal recording of said first and second pulse signals;

(ii) a stored program processor, including memory means having a plurality of selectively addressable storage locations for accumulating in separate storage locations thereof said first and second pulse signals as first and second pulse counts respectively, said first and second pulse counts each having a value substantially proportional to the independent measure of electrical energy consumption as represented by each of said first and second pulse signals respectively, said stored program processor further including, means for directing the accumulation of said first and second pulse signals into said separate storage locations of said memory means to form said first and second pulse counts, means for recurrently comparing said first and second pulse counts, and means for enabling said means for signaling when the difference between the values of said first and second pulse counts exceeds a predetermined threshold value.

32. In an electric power distribution system for accumulating electrical energy usage data representative of different measured electrical parameters, the combination comprising:

(a) first and second electronic meters connected to said system for metering electrical energy usage, each adapted to generate a first pulse signal and a second pulse signal, the first pulse signal generated by each of said first and second electronic meters each being representative of a redundant measure of a first measured electrical parameter, and each second pulse signal being representative of a redundant measure of a second measured electrical parameter; and (b) an electronic recorder including, (i) a first pair of data channels, each data channel coupled to a corresponding one of said first and second electronic meters for receiving therefrom a corresponding first pulse signal, each data channel of said first pair adapted to accumulate its correspondingly received first pulse signal, to thereby establish redundant pulse counts in said first pair of data channels, the pulse count in each data channel having a value substantially proportional to a first measured electrical parameter, (ii) a second pair of data channels, each data channel coupled to a corresponding one of said first and second electronic meters for receiving therefrom a corresponding second pulse signal, each data channel of said second pair adapted to accumulate its correspondingly received second pulse signal, to thereby establish redundant pulse counts in said second pair of data channels, the pulse count in each data channel having a value substantially proportional to a second measured electrical parameter, and (iii) means for recurrently comparing the redundant pulse counts in said first pair of data channels and the redundant pulse counts in said second pair of data channels, and providing an indication representative of a system abnormality disrupting the normal accumulation of said first and second pulse signals by either of said first and second pair of data channels respectively when the difference between the values of the redundant pulse counts in either one of said first and second pair of data channels exceeds a predetermined threshold value.

33. In a system of the type for recording electrical energy usage data from a remote site, the combination comprising:

(a) first and second meters, each serving to meter electrical energy consumed by a load connected to each of said first and second meters, each of said first and second meters including a pulse source means for generating first and second pulse signals, said first and second pulse signals being representative of substantially redundant independent measures of the electrical energy consumed by a load connected to each of said first and second meters; and (b) a stored program recorder, including,
  (i) a first pair of data channels coupled to the pulse source means of said first meter,
  (ii) a second pair of data channels coupled to the pulse source means of said second meter, each of said first pair and said second pair of data channels adapted to accumulate the first and second pulse signals from its respectively coupled pulse source means, to thereby establish therein redundant first and second pulse counts,
  (iii) means for controlling the accumulation of said first and second pulse signals by each of said first pair and said second pair of data channels,
  (iv) means for recurrently comparing the redundant first and second pulse counts of each of said first pair and said second pair of data channels, and
  (v) means, responsive to said means for recurrently comparing, for providing an error indication representative of a system abnormality disrupting the normal accumulation of said first and second pulse signals in either of said first pair and said second pair of data channels when the difference between the values of the redundant first and second pulse counts in either of said first pair and said second pair of data channels exceeds a predetermined threshold value.

34. In an electricity metering system, a method of metering electricity energy usage by a load and providing an indication of a system malfunction, comprising the steps of:
  (a) generating first and second pulse signals, said first and second pulse signals being representative of substantially duplicate independent measures of the same energy usage by said load;
  (b) accumulating said first and second pulse signals as first and second redundant pulse counts respectively, each having a value proportional to a substantially independent measure of the energy usage by said load;
  (c) comparing, recurrently, the values of said first and second pulse counts; and
  (d) providing an indication representative of a malfunction in the electricity metering system when the difference between the values of said first and second pulse counts exceeds a predetermined threshold value.

35. The method of claim 34, including the step of storing the accumulated first and second pulse signals to provide redundant backup energy usage data.

36. The method of claim 34, including the step of initiating a telephone call to a data center as notification of a malfunction in the electricity metering system.

37. In an electricity metering system, a method of accumulating backup electrical energy usage data and providing an indication of a system abnormality affecting the normal accumulation of such electrical energy usage data, comprising the steps of:
  (a) generating first and second pulse signals, each having a different pulse format and each being representative of a substantially duplicate independent measure of electrical energy usage;
  (b) accumulating said first and second pulse signals as first and second redundant pulse counts respectively, each having a value proportional to a substantially independent measure of the electrical energy usage as represented by said first and second pulse signals;
  (c) comparing the values of said first and second pulse counts;
  (d) storing said first and second pulse counts as backup electrical energy usage data; and
  (e) providing an indication that a system abnormality exists affecting the normal accumulation of at least a one of said first and second pulse signals when the difference between the values of said first and second pulse counts exceeds a predetermined threshold value.

38. A method of accumulating backup electrical energy usage data from a remotely located electricity meter and verifying the accuracy of such data, comprising the steps of:
  (a) generating, from said electricity meter, first and second pulse signals, each representative of a substantially duplicate independent measure of electrical energy usage at the location of said electricity meter;
  (b) accumulating said first and second pulse signals to develop redundant first and second electrical energy usage counts respectively;
  (c) storing said first and second electrical energy usage counts as backup electrical energy usage data;
  (d) comparing, recurrently, the accumulated first and second electrical energy usage counts to verify that the difference between the values thereof is within a predetermined threshold value;
  (e) providing a detectable indication representative of a malfunction disrupting the normal accumulation of said first and second pulse signals when the difference between the values of said first and second electrical energy usage counts is not within said predetermined threshold value; and
  (f) presetting each of the accumulated first and second electrical energy usage counts to a prescribed count following each comparison of said first and second energy usage counts.

39. In a remote meter reading system of the type including an electricity meter connected to a programmable electronic recorder of the type adapted to communicate with a data processing center, a method of accumulating verifiable electrical energy usage data from the electricity meter and notifying the data processing center of a system abnormality affecting the normal accumulation of electrical energy usage data, comprising the steps of:
  (a) providing, to said electronic recorder from said electricity meter, first and second pulse signals, each being representative of a substantially duplicate independent measure of electrical energy usage at the location of said electricity meter;
  (b) accumulating, in a memory of said electronic recorder, said first and second pulse signals to develop redundant first and second electrical energy usage counts respectively;
  (c) storing, in a memory of said electronic recorder, said first and second electrical energy usage counts as backup electrical energy usage data;
  (d) comparing, recurrently, in said electronic recorder, said first and second electrical energy usage counts to verify that the difference between the values of said first and second electrical energy usage counts is within a predetermined threshold value; and (e) calling said data processing center, from said electronic recorder, when the difference between the values of said first and second electrical energy usage counts is not within said predetermined threshold value as notification of a system abnormality affecting the normal accumulation of said first and second pulse signals in the memory of said electronic recorder.

40. In an electricity metering system for metering electrical energy consumed by a load, a method of accumulating verifiable electrical energy usage data representative of different measured electrical parameters, comprising the steps of:

(a) providing first and second meters for the redundant metering of electrical energy consumed by a load at the location of said first and second meters;

(b) generating from each of said first and second meters first and second pulse signals, the first pulse signals each being representative of a redundant measure of a first measured electrical parameter and the second pulse signals each being representative of a redundant measure of a second measured electrical parameter;

(c) accumulating the first pulse signals from each of said first and second meters to develop redundant first and second pulse counts, each having a value substatially proportional to a first measured electrical parameter;

(d) accumulating the second pulse signals from each of said first and second meters to develop redundant third and fourth counts, each having a value substantially proportional to a second measured electrical parameter;

(e) comparing, recurrently, said first and second pulse counts;

(f) comparing, recurrently, said third and fourth pulse counts; and (g) providing a detectable indication representative of a system abnormality disrupting the normal accumulation of said first and second pulse signals from either of said first and second pulse signals from either of said first and second meters when the difference between the values of either of said first and second pulse counts and said third and fourth pulse counts exceeds a predetermined threshold value.

41. The method of claim 40, including the step of storing said first and second pulse counts and said third and fourth pulse counts as backup electrical energy usage data representative of said first and second measured electrical parameters.

42. The method of claim 40, wherein the step of providing a detectable indication further includes the step of identifying which of said first and second pulse counts and said third and fourth pulse counts provided said detectable indication.

43. In a remote meter reading system of the type including an electricity meter providing pulse signals representative of energy usage data to an electronic recorder having an executable program stored in a memory of the recorder, a method of recording verifiable energy usage data and signalling the occurrence of a pulse signal recording error, comprising the steps of:

(a) providing, to said electronic recorder from said electricity meter, first and second pulse signals, each being representative of a substantially duplicate independent measure of electrical energy usage at the location of said electricity meter;

(b) providing, in said electronic recorder, first and second channels for receiving said first and second pulse signals respectively; and (c) executing the program in said electronic recorder while,
  (i) reading said first and second pulse signals into said first and second channels respectively;
  (ii) accumulating, in said first and second channels, those of said first and second pulse signals, respectively, which are present at said electronic recorder at the time of reading to develop first and second pulse counts, while counting the number of accumulated first and second pulse signals to establish first and second count limits, respectively, to be achieved,
  (iii) storing the first and second pulse counts developed in the step of accumulating as redundantly verifiable backup energy usage data,
  (iv) testing to see if either of said first and second count limits has been achieved,
  (v) repeating the preceding steps of executing the program until a one of said first and second count limits is achieved,
  (vi) comparing the number of that one of said first and second pulse signals counted which has not achieved its count limit with a predetermined threshold value to determine if a pulse signal accumulation error has occurred in either one of said first and second channels,
  (vii) creating, in the memory of said electronic recorder, a status error log identifying the one of said first and second channels wherein the accumulation error occurred when the number compared with the predetermined threshold value, in the step of comparing, is greater than the predetermined threshold value, and
  (viii) providing a detectable indication of the occurrence of an accumulation error.

44. The method of claim 43, wherein the step of creating further includes the step of recording the time and date of the occurrence of the accumulation error.

45. In an electricity metering system apparatus for remotely monitoring the operation of meters, comprising:

(a) first and second meters connected to said system for metering electrical energy usage by a load connected to the meters, each of said meters including means for generating pulse signals, the pulse signals from said first and second meters normally being representative of redundant measures of the electrical energy usage by the load;

(b) a pair of data channels, each data channel coupled to a corresponding one of said first and second meters for receiving therefrom the pulse signals generated thereby, each data channel of said pair, adapted to accumulate its correspondingly received pulse signals to thereby establish redundant pulse counts in said pair of data channels, the pulse count in each data channel normally having a value substantially proportional to electrical energy usage by the load; and (c) means for recurrently comparing the pulse counts in said pair of data channels and providing an indication identifying a one of said first and second meters which is generating pulse signals at a different rate than the pulse signals being generated by the other meter when the difference between the values of the pulse counts in said pair of data channels exceeds a predetermined threshold value.

* * * * *